(12) United States Patent
Hirase et al.

(10) Patent No.: US 12,033,872 B2
(45) Date of Patent: Jul. 9, 2024

(54) SUBSTRATE PROCESSING APPARATUS AND SUBSTRATE PROCESSING METHOD

(71) Applicant: Tokyo Electron Limited, Tokyo (JP)

(72) Inventors: Keita Hirase, Kumamoto (JP); Koji Ogura, Kumamoto (JP); Hiroshi Yoshida, Kumamoto (JP); Takashi Nagai, Kumamoto (JP); Jun Nonaka, Kumamoto (JP); Takumi Honda, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 58 days.

(21) Appl. No.: 17/326,821

(22) Filed: May 21, 2021

(65) Prior Publication Data

US 2021/0366740 A1 Nov. 25, 2021

(30) Foreign Application Priority Data

May 25, 2020 (JP) .................................. 2020-090897
Apr. 12, 2021 (JP) .................................. 2021-066941

(51) Int. Cl.
*H01L 21/67* (2006.01)
*H01L 21/311* (2006.01)

(52) U.S. Cl.
CPC .. *H01L 21/67057* (2013.01); *H01L 21/31111* (2013.01); *H01L 21/67017* (2013.01); *H01L 21/67086* (2013.01)

(58) Field of Classification Search
CPC ......... H01L 21/67057; H01L 21/31111; H01L 21/67017; H01L 21/67086
See application file for complete search history.

(56) References Cited

U.S. PATENT DOCUMENTS

| 2004/0200806 A1* | 10/2004 | Izuta ......................... C23F 1/46 216/99 |
| 2013/0220478 A1* | 8/2013 | Kasahara .................. B65B 3/04 141/2 |
| 2015/0200116 A1* | 7/2015 | Yamada ............ H01L 21/67086 137/1 |

(Continued)

FOREIGN PATENT DOCUMENTS

JP 2017-118092 A 6/2017

*Primary Examiner* — Keath T Chen
*Assistant Examiner* — Margaret Klunk
(74) *Attorney, Agent, or Firm* — Venjuris, P.C.

(57) ABSTRACT

A substrate processing apparatus includes: a processing container, a mixing device, a liquid feeding path, and a controller. The processing container processes a substrate by immersing the substrate in a processing liquid. The mixing device mixes a phosphoric acid aqueous solution and an additive, to produce a mixed liquid to be used as a raw material of the processing liquid. The liquid feeding path feeds the mixed liquid from the mixing device to the processing container. The controller controls the substrate processing apparatus. The controller performs a control to feed the mixed liquid from the mixing device to the processing container in which the substrate is immersed, after a phosphoric acid concentration of the mixed liquid is regulated from a first concentration to a second concentration higher than the first concentration. The first concentration is a concentration when the phosphoric acid aqueous solution is supplied to the mixing device.

13 Claims, 13 Drawing Sheets

(56) References Cited

U.S. PATENT DOCUMENTS

| | | | |
|---|---|---|---|
| 2015/0262737 A1* | 9/2015 | Hinode | H01L 21/6708 156/345.18 |
| 2018/0247841 A1* | 8/2018 | Nagai | H01L 21/67253 |
| 2019/0080938 A1* | 3/2019 | Kawazu | H01L 21/67173 |
| 2019/0096711 A1* | 3/2019 | Ohno | H01L 21/67017 |

* cited by examiner

SUBSTRATE PROCESSING APPARATUS AND SUBSTRATE PROCESSING METHOD

CROSS-REFERENCE TO RELATED APPLICATIONS

This application is based on and claims priority from Japanese Patent Application Nos. 2020-090897 and 2021-066941, filed on May 25, 2020 and Apr. 12, 2021, respectively, with the Japan Patent Office, the disclosures of which are incorporated herein in their entireties by reference.

TECHNICAL FIELD

The present disclosure relates to a substrate processing apparatus and a substrate processing method.

BACKGROUND

In the substrate processing system of the related art, it is known to perform an etching on a substrate by immersing the substrate in an etching liquid that contains a phosphoric acid aqueous solution and an additive for suppressing a precipitation of silicon oxide ($SiO_2$) (see, e.g., Japanese Laid-Open Patent Publication No. 2017-118902).

SUMMARY

According to an aspect of the present disclosure, a substrate processing apparatus includes: a processing container, a mixing device, a liquid feeding path, and a controller. The processing container processes a substrate by immersing the substrate in a processing liquid. The mixing device mixes a phosphoric acid aqueous solution and an additive, to produce a mixed liquid to be used as a raw material of the processing liquid. The liquid feeding path feeds the mixed liquid from the mixing device to the processing container. The controller controls the substrate processing apparatus. The controller performs a control to feed the mixed liquid from the mixing device to the processing container in which the substrate is immersed, after a phosphoric acid concentration of the mixed liquid is regulated from a first concentration to a second concentration higher than the first concentration. The first concentration is a concentration when the phosphoric acid aqueous solution is supplied to the mixing device.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of a substrate processing apparatus and a substrate processing method according to the present disclosure will be described in detail with reference to the accompanying drawings. The present disclosure is not limited to the embodiments. Further, the drawings are schematic, and the dimensional relationship, ratio and others of respective components may be different from the actual dimensional relationships and ratios. Further, portions commonly included in the respective drawings may be different from each other in dimensional relationship and ratio.

In the substrate processing system of the related art, it is known to perform an etching on a substrate by immersing the substrate in an etching liquid that contains a phosphoric acid aqueous solution and an additive for suppressing a precipitation of silicon oxide.

For example, when a silicon nitride film (SiN) and a silicon oxide film ($SiO_2$) are stacked on a substrate, the silicon nitride film may be selectively etched by immersing the substrate in a phosphoric acid ($H_3PO_4$) aqueous solution.

Further, by adding an additive for suppressing the precipitation of silicon oxide (hereinafter, also referred to as a "precipitation inhibitor") to the phosphoric acid aqueous solution, the silicon oxide may be suppressed from being precipitated on the silicon oxide film during the etching.

However, the above-described related art needs to be improved in view of appropriately etching the substrate.

Accordingly, it is expected to implement a technology capable of resolving the problem described above and appropriately performing the etching with the etching liquid that contains the phosphoric acid aqueous solution and the precipitation inhibitor.

<Configuration of Substrate Processing System>

Figure 1:
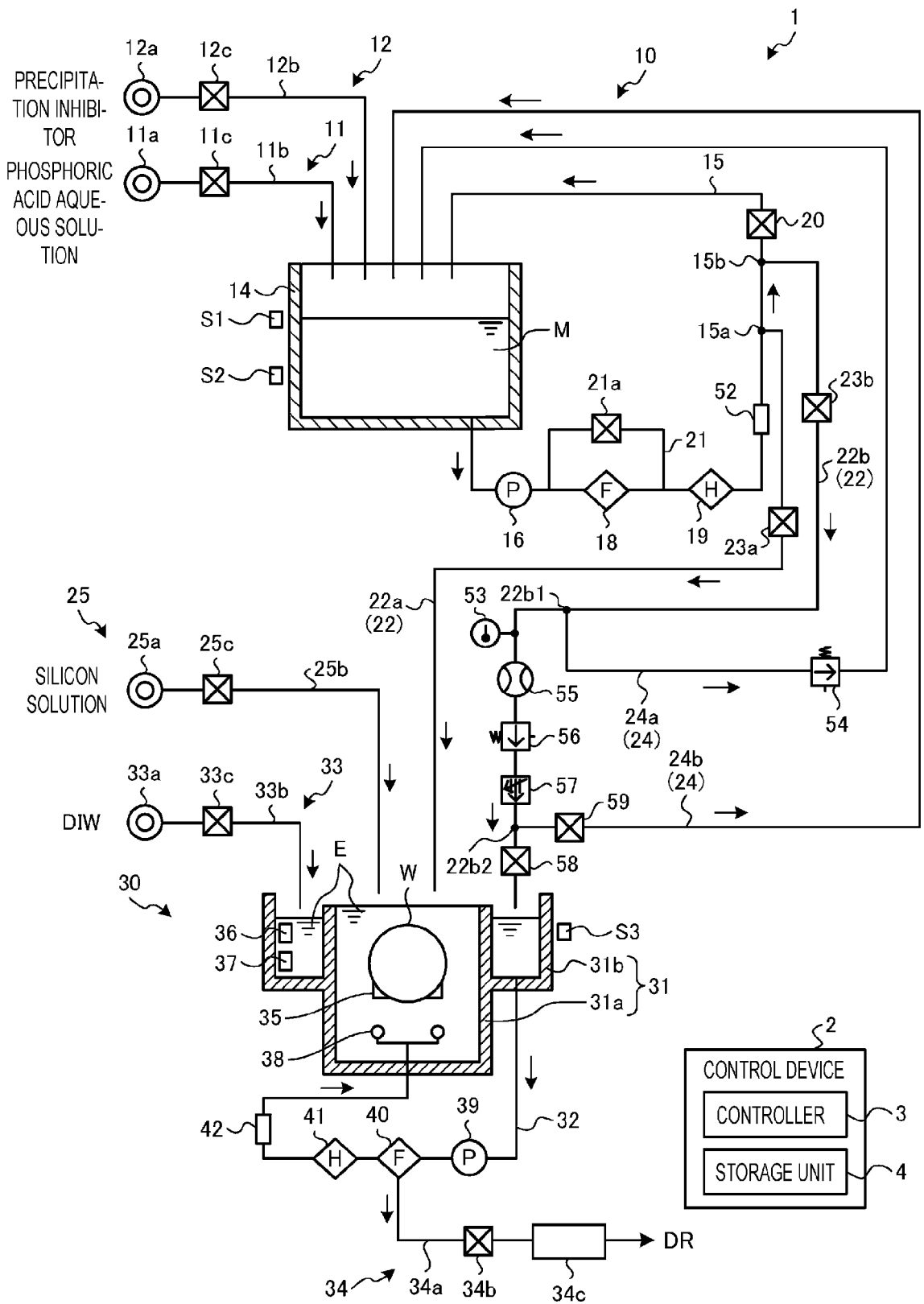
FIG. 1 is a schematic block diagram illustrating a configuration of a substrate processing system according to an embodiment.

First, a configuration of a substrate processing system 1 according to an embodiment will be described with reference to FIG. 1. FIG. 1 is a schematic block diagram illustrating the configuration of the substrate processing system 1 according to the embodiment. The substrate processing system 1 is an example of a substrate processing apparatus.

The substrate processing system 1 includes a mixing device 10, a silicon solution supply 25, and a substrate processing unit 30. The mixing device 10 mixes a phosphoric acid aqueous solution and a precipitation inhibitor that suppresses the precipitation of silicon oxide with each other, to produce a mixed liquid M. The precipitation inhibitor is an example of an additive.

The silicon solution supply 25 supplies a silicon-containing compound aqueous solution (hereinafter, also referred to as a silicon solution) to the mixed liquid M produced in the mixing device 10, so as to produce an etching liquid E. That is, the etching liquid E according to the embodiment contains the phosphoric acid aqueous solution, the precipitation inhibitor, and the silicon solution. The etching liquid E is an example of a processing liquid.

The substrate processing unit 30 immerses wafers W in the produced etching liquid E inside a processing container 31, so as to perform an etching on the wafers W. Each wafer W is an example of a substrate. In the embodiment, for example, when a silicon nitride film (SiN) and a silicon oxide film ($SiO_2$) are formed on the wafer W, the silicon nitride film may be selectively etched.

The substrate processing system 1 further includes a control device 2. The control device 2 is, for example, a computer, and includes a controller 3 and a storage unit 4. The storage unit 4 stores a program for controlling various processes performed in the substrate processing system 1. The controller 3 reads and executes the program stored in the storage unit 4, so as to control the operation of the substrate processing system 1.

The program may be recorded in a computer-readable recording medium, and may be installed from the recording medium to the storage unit 4 of the control device 2. The computer-readable recording medium may be, for example, a hard disk (HD), a flexible disk (PD), a compact disk (CD), a magneto-optical disk (MO), or a memory card.

The mixing device 10 includes a phosphoric acid aqueous solution supply 11, a precipitation inhibitor supply 12, a tank 14, and a circulation path 15.

The phosphoric acid aqueous solution supply 11 supplies the phosphoric acid aqueous solution to the tank 14. The phosphoric acid aqueous solution supply 11 includes a phosphoric acid aqueous solution supply source 11a, a phosphoric acid aqueous solution supply path 11b, and a flow rate regulator 11c.

The phosphoric acid aqueous solution supply source 11a is, for example, a tank that stores the phosphoric acid aqueous solution. The phosphoric acid aqueous solution supply path 11b connects the phosphoric acid aqueous solution supply source 11a and the tank 14 to each other, and supplies the phosphoric acid aqueous solution from the phosphoric acid aqueous solution supply source 11a to the tank 14.

The flow rate regulator 11c is provided in the phosphoric acid aqueous solution supply path 11b, and regulates the flow rate of the phosphoric acid aqueous solution supplied to the tank 14. The flow rate regulator 11c is configured by, for example, an opening/closing valve, a flow rate control valve, or a flow meter.

The precipitation inhibitor supply 12 supplies the precipitation inhibitor to the tank 14. The precipitation inhibitor supply 12 includes a precipitation inhibitor supply source 12a, a precipitation inhibitor supply path 12b, and a flow rate regulator 12c.

The precipitation inhibitor supply source 12a is, for example, a tank that stores the precipitation inhibitor. The precipitation inhibitor supply path 12b connects the precipitation inhibitor supply source 12a and the tank 14 to each other, and supplies the precipitation inhibitor from the precipitation inhibitor supply source 12a to the tank 14.

The flow rate regulator 12c is provided in the precipitation inhibitor supply path 12b, and regulates the flow rate of the precipitation inhibitor supplied to the tank 14. The flow rate regulator 12c is configured by, for example, an opening/closing valve, a flow rate control valve, or a flow meter.

The precipitation inhibitor according to the embodiment may contain a component that suppresses the precipitation of silicon oxide. For example, the precipitation inhibitor may contain a component that suppresses the precipitation of silicon oxide by stabilizing silicon ions dissolved in the phosphoric acid aqueous solution in the dissolved state. Further, the precipitation inhibitor may contain a component that suppresses the precipitation of silicon oxide through other known methods.

As the precipitation inhibitor according to the embodiment, for example, a hexafluorosilicic acid ($H_2SiF_6$) aqueous solution that contains a fluorine component may be used. Further, in order to stabilize the hexafluorosilicic acid in the aqueous solution, an additive such as ammonia may be contained.

As the precipitation inhibitor according to the embodiment, for example, ammonium hexafluorosilicate (($NH_4$)$_2$$SiF_6$) or sodium hexafluorosilicate ($Na_2SiF_6$) may be used.

The precipitation inhibitor according to the embodiment may be a compound that contains a cationic element having an ion radius of 0.2 Å to 0.9 Å. Here, the "ion radius" is the radius of an ion obtained empirically from the sum of radii of an anion and a cation that is obtained from a lattice constant of a crystal lattice.

The precipitation inhibitor according to the embodiment may contain, for example, oxide of any one element of aluminum, potassium, lithium, sodium, magnesium, calcium, zirconium, tungsten, titanium, molybdenum, hafnium, nickel, and chromium.

The precipitation inhibitor according to the embodiment may contain at least one of nitride, chloride, bromide, hydroxide, and nitrate of the element described above, instead of or in addition to the element.

The precipitation inhibitor according to the embodiment may contain, for example, at least one of $Al(OH)_3$, $AlCl_3$, $AlBr_3$, $Al(NO_3)_3$, $Al_2(SO4)_3$, $AlPO_4$, and $Al_2O_3$.

The precipitation inhibitor according to the embodiment may contain at least one of KCl, KBr, KOH, and $KNO_3$. Further, the precipitation inhibitor according to the embodiment may contain at least one of LiCl, NaCl, $MgCl_2$, $CaCl_2$, and $ZrCl_4$.

The tank 14 stores the phosphoric acid aqueous solution supplied from the phosphoric acid aqueous solution supply 11 and the precipitation inhibitor supplied from the precipitation inhibitor supply 12. Further, the tank 14 stores the mixed liquid M produced by mixing the phosphoric acid aqueous solution and the precipitation inhibitor with each other.

In the tank 14, a first liquid level sensor S1 and a second liquid level sensor S2 are provided in this order from above. Thus, the height of the liquid level of the phosphoric acid aqueous solution or the mixed liquid M stored in the tank 14 is controlled. Further, in the embodiment, the liquid amount of the phosphoric acid aqueous solution or the precipitation inhibitor may be weighed using the first liquid level sensor S1 and the second liquid level sensor S2.

The circulation path 15 is a circulation line that exits from the tank 14 and returns to the tank 14. The circulation path 15 includes an inlet provided at the bottom of the tank 14, and an outlet provided at the top of the tank 14, and forms a circulation flow that flows from the inlet toward the outlet. In the embodiment, the outlet is disposed above the liquid level of the mixed liquid M stored in the tank 14.

In the circulation path 15, a first pump 16, a filter 18, a first heater 19, a phosphoric acid concentration sensor 52, branch portions 15a and 15b, and a valve 20 are provided in this order from the upstream of the circulation path 15 close to the tank 14. The first heater 19 is an example of a heating mechanism.

The first pump 16 forms the circulation flow of the mixed liquid M that exits from the tank 14, passes through the circulation path 15, and returns to the tank 14.

The filter 18 removes contaminants such as particles included in the mixed liquid M that circulates in the circulation path 15. Further, in the circulation path 15, a bypass flow path 21 is provided to bypass the filter 18, and an opening/closing valve 21a is provided in the bypass flow path 21.

Then, by opening/closing the opening/closing valve 21a provided in the bypass flow path 21, either the circulation flow that flows through the filter 18 or the circulation flow that bypasses the filter 18 may be formed. This is because the pressure loss in the filter 18 is relatively large, and thus, the circulation flow that flows through the filter 18 is not formed in a state where the opening/closing valve 21a is opened.

The first heater 19 heats the mixed liquid M that circulates in the circulation path 15. In the embodiment, by heating the mixed liquid M with the first heater 19, the mixed liquid M stored in the tank 14 is heated.

The phosphoric acid concentration sensor 52 detects the phosphoric acid concentration of the mixed liquid M that circulates in the circulation path 15. A signal generated by the phosphoric acid concentration sensor 52 is transmitted to the controller 3 described above.

Liquid feeding paths 22 are branched from the branch portions 15a and 15b, respectively, to feed the mixed liquid M to the processing container 31 of the substrate processing unit 30. Specifically, a first liquid feeding path 22a is branched from the branch portion 15a to feed the mixed liquid M to an inner tank 31a of the processing container 31, and a second liquid feeding path 22b is branched from the branch portion 15b to feed the mixed liquid M to an outer tank 31b of the processing container 31. That is, the liquid feeding paths 22 include the first liquid feeding path 22a and the second liquid feeding path 22b.

A first flow rate regulator 23a is provided in the first liquid feeding path 22a. The first flow rate regulator 23a regulates the flow rate of the mixed liquid M supplied to the inner tank 31a of the processing container 31. The first flow rate regulator 23a is configured by, for example, an opening/closing valve, a flow rate control valve, or a flow meter.

In the second liquid feeding path 22b, a second flow rate regulator 23b, a branch portion 22b1, a thermometer 53, a flow meter 55, a constant pressure valve 56, a throttle valve 57, and a branch portion 22b2, and a valve 58 are provided in this order from upstream.

The second flow rate regulator 23b regulates the flow rate of the mixed liquid M supplied to the outer tank 31b of the processing container 31. The second rate regulator 23b is configured by, for example, an opening/closing valve, a flow rate control valve, or a flow meter.

A first return path 24a is branched from the branch portion 22b1 to return the mixed liquid M to the tank 14. The first return path 24a includes a back pressure valve 54. The back pressure valve 54 regulates the pressure in the upstream of the first return path 24a (e.g., the branch portion 22b1) from the back pressure valve 54.

The thermometer 53 measures the temperature of the mixed liquid M that flows in the second liquid feeding path 22b. The flow meter 55 measures the flow rate of the mixed liquid M that flows in the second liquid feeding path 22b. The flow meter 55 corrects the flow rate of the mixed liquid M based on the temperature of the mixed liquid M measured by the thermometer 52. For example, the controller 3 corrects flow rate information of the mixed liquid M that is obtained from the flow meter 55, based on temperature information of the mixed liquid M that is obtained from the thermometer 52.

Thus, in the embodiment, even in a case where the temperature of the mixed liquid M changes largely in the range from the room temperature to a high temperature, the flow rate of the mixed liquid M that flows through the flow meter 55 may be accurately measured.

The constant pressure valve 56 regulates the pressure in the downstream of the second liquid feeding path 22b from the constant pressure valve 56. The throttle valve 57 regulates the flow rate of the mixed liquid M that flows in the second liquid feeding path 22b.

A second return path 24b is branched from the branch portion 22b2 to return the mixed liquid M to the tank 14. In this way, in the embodiment, the return paths 24 configured by the first return path 24a and the second return path 24b are branched from the second liquid feeding path 22b, and return the mixed liquid M that flows in the second liquid feeding path 22b to the tank 14. The second return path 24b includes a valve 59.

The controller 3 alternately opens and closes the valves 58 and 59. As a result, the controller 3 is able to feed the mixed liquid M to the outer tank 31b or the tank 14 in the switching manner.

The silicon solution supply 25 adds the silicon solution to the mixed liquid M produced in the mixing device 10. The silicon solution according to the embodiment is, for example, a solution in which colloidal silicon is dispersed.

The silicon solution supply 25 includes a silicon solution supply source 25a, a silicon solution supply path 25b, and a flow rate regulator 25c.

The silicon solution supply source 25a is, for example, a tank that stores the silicon solution. The flow rate regulator 25c is provided in the silicon solution supply path 25b, and regulates the flow rate of the silicon solution that flows in the silicon solution supply path 25b. The silicon solution supply path 25b is connected to the inner tank 31a of the processing container 31. The flow rate regulator 25c is configured by, for example, an opening/closing valve, a flow rate control valve, or a flow meter.

The substrate processing unit 30 immerses the wafers W in the etching liquid E produced in the mixing device 10, so as to perform the etching on the wafers W.

The substrate processing unit 30 includes the processing container 31, the circulation path 32, a DIW supply 33, and a processing liquid discharge unit 34. The processing container 31 includes the inner tank 31a and the outer tank 31b.

The inner tank 31a is opened at the top thereof, and the etching liquid E is supplied to the vicinity of the top. In the inner tank 31a, a plurality of wafers W is immersed in the etching liquid E by a substrate lifting mechanism 35, and the etching is performed on the wafers W. The substrate lifting mechanism 35 is configured to be movable up and down, and holds the plurality of wafers W in a vertical posture side by side in the front and rear direction.

The outer tank 31b is provided around the upper portion of the inner tank 31a, and opened at the top thereof. The etching liquid E that flows over the inner tank 31a flows into the outer tank 31b.

A third liquid level sensor S3 is provided in the outer tank 31b. Thus, the height of the liquid level of the mixed liquid M or the etching liquid E that is stored in the outer tank 31b is controlled. Further, in the embodiment, the liquid amount of the mixed liquid M may be weighed using the third liquid level sensor S3. Details of the process of weighing the mixed liquid M will be described later.

The mixed liquid M is supplied from the mixing device 10 to the inner tank 31a and the outer tank 31b through the liquid feeding paths 22. Further, the silicon solution is supplied from the silicon solution supply 25 to the inner tank 31a. Further, deionized water (DIW) is supplied from the DIW supply 33 to the outer tank 31b.

The DIW supply 33 includes a DIW supply source 33a, a DIW supply path 33b, and a flow rate regulator 33c. The DIW supply 33 supplies the DIW to the outer tank 31b in order to regulate the concentration of the etching liquid E stored in the processing container 31.

The DIW supply path 33b connects the DIW supply source 33a and the outer tank 31b to each other, and supplies the DIW having a predetermined temperature from the DIW supply source 33a to the outer tank 31b.

The flow rate regulator 33c is provided in the DIW supply path 33b, and regulates the supply amount of the DIW supplied to the outer tank 31b. The flow rate regulator 33c is configured by, for example, an opening/closing valve, a flow rate control valve, or a flow meter. The supply amount of the DIW is regulated by the flow rate regulator 33c, so that the temperature, the phosphoric acid concentration, the silicon concentration, and the precipitation inhibitor concentration of the etching liquid E are regulated.

Further, a temperature sensor 36 and a phosphoric acid concentration sensor 37 are provided in the outer tank 31b. The temperature sensor 36 detects the temperature of the etching liquid E, and the phosphoric acid concentration sensor 37 detects the phosphoric acid concentration of the etching liquid E. Signals generated by the temperature sensor 36 and the phosphoric acid concentration sensor 37 are transmitted to the controller 3 described above.

The outer tank 31b and the inner tank 31a are connected to each other by a circulation path 32. One end of the circulation path 32 is connected to the bottom of the outer tank 31b, and the other end of the circulation path 32 is connected to a processing liquid supply nozzle 38 provided inside the inner tank 31a.

In the circulation path 32, a second pump 39, a filter 40, a second heater 41, and a silicon concentration sensor 42 are provided in this order from the outer tank 31b.

The second pump 39 forms a circulation flow of the etching liquid E that is fed from the outer tank 31b to the inner tank 31a through the circulation path 32. Further, the etching liquid E flows over the inner tank 31a, thereby flowing out into the outer tank 31b again. In this way, the circulation flow of the etching liquid E is formed in the substrate processing unit 30. That is, the circulation flow is formed in the outer tank 31b, the circulation path 32, and the inner tank 31a.

The filter 40 filters the etching liquid E that circulates in the circulation path 32. The second heater 41 regulates the temperature of the etching liquid E that circulates in the circulation path 32. The silicon concentration sensor 42 detects the silicon concentration of the etching liquid E that circulates in the circulation path 32. A signal generated by the silicon concentration sensor 42 is transmitted to the controller 3.

For example, when the mixed liquid M stored at the time of generating the etching liquid E or the etching liquid E used in the etching is entirely or partially replaced, the processing liquid discharge unit 34 discharges the mixed liquid M or the etching liquid E to a drain DR. The processing liquid discharge unit 34 includes a discharge path 34a, a flow rate regulator 34b, and a cooling tank 34c.

The discharge path 34a is connected to the circulation path 32. The flow rate regulator 34b is provided in the discharge path 34a, and regulates the discharge amount of the mixed liquid M or the etching liquid E to be discharged. The flow rate regulator 34b is configured by, for example, an opening/closing valve, a flow rate control valve, or a flow meter.

The cooling tank 34c temporarily stores and cools the mixed liquid M or the etching liquid E that has flowed in the discharge path 34a. In the cooling tank 34c, the discharge amount of the mixed liquid M or the etching liquid E is regulated by the flow rate regulator 34b.

<Procedure of Substrate Processing>

Figure 2:
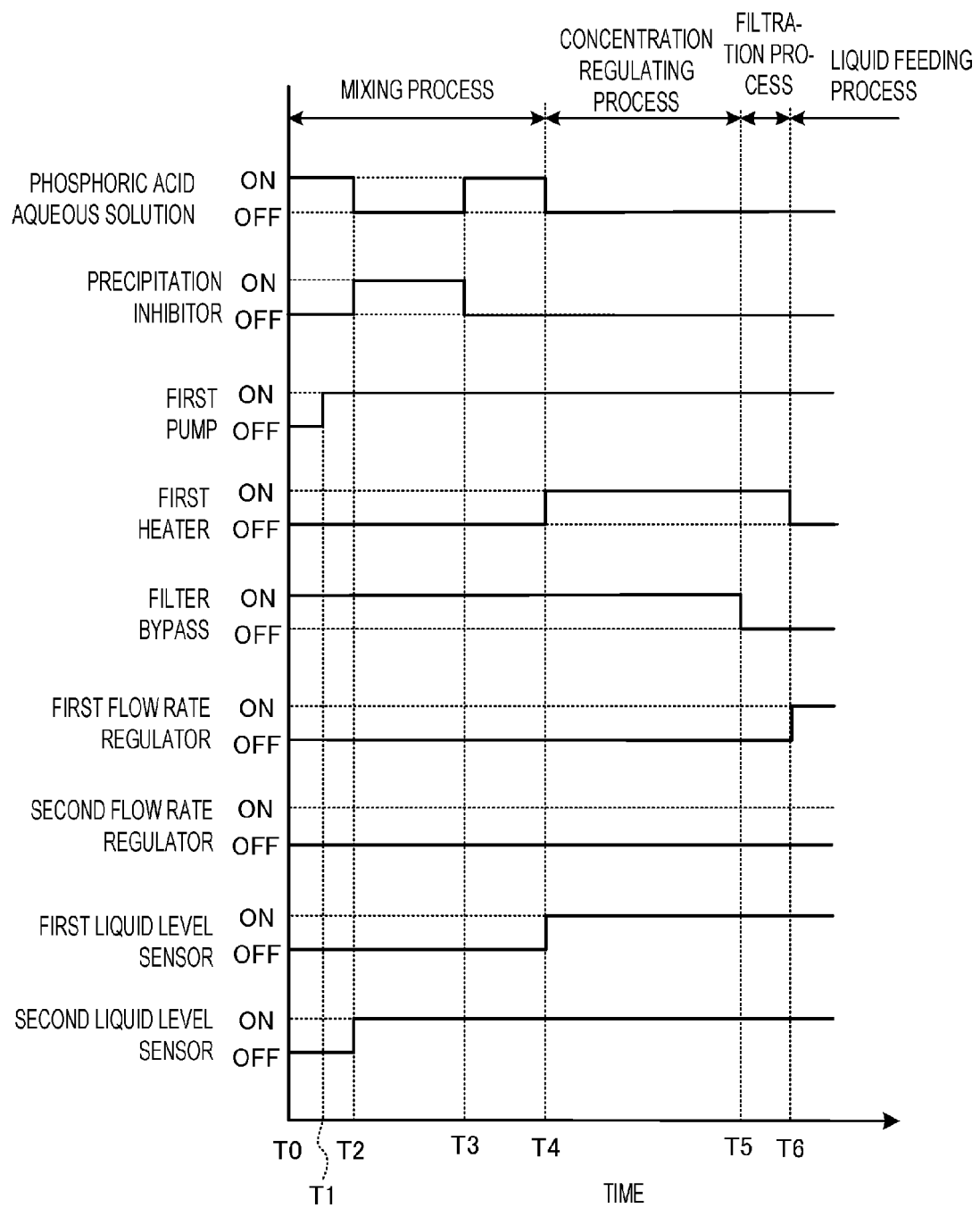
FIG. 2 is a timing chart illustrating a specific example of a behavior pattern of each component of the substrate processing system in various processes performed when a mixed liquid is fed to a processing container at a first time according to the embodiment.
Figure 3:
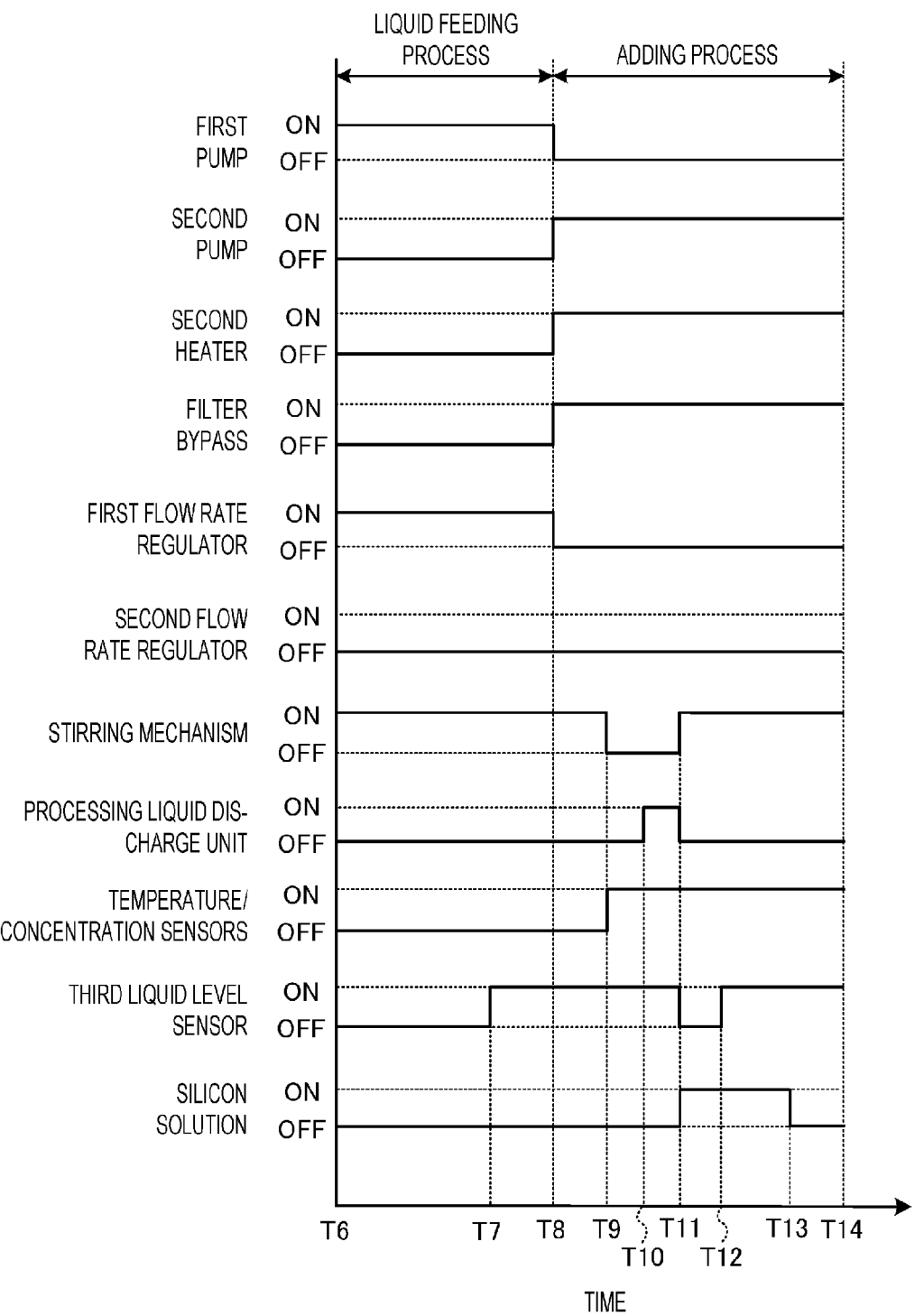
FIG. 3 is a timing chart illustrating a specific example of a behavior pattern of each component of the substrate processing system in the various processes performed when the mixed liquid is fed to the processing container at the first time according to the embodiment.

Subsequently, the procedure of the substrate processing according to the embodiment will be described with reference to FIGS. 2 to 7. FIGS. 2 and 3 are each a timing chart illustrating a specific example of a behavior pattern of each component of the substrate processing system 1 in various processes performed when the mixed liquid M is fed to the processing container 31 at a first time according to the embodiment.

Further, FIG. 2 represents the first half of the various processes performed when the mixed liquid M is fed to the processing container 31 at a first time, and FIG. 3 represents the second half of the various processes performed when the mixed liquid M is fed to the processing container 31 at a first time.

As illustrated in FIGS. 2 and 3, in the embodiment, a mixing process, a concentration regulating process, a filtration process, a liquid feeding process, and an adding process are performed in an order. First, the controller 3 starts the mixing process by operating (turning ON) the phosphoric acid aqueous solution supply 11 from time T0 to supply the phosphoric acid aqueous solution to the tank 14.

At the timing of the time T0, the precipitation inhibitor supply 12, the first pump 16, and the first heater 19 are not operated (OFF state). Further, since the opening/closing valve 21*a* is opened at the timing of the time T0, the filter 18 is in a state of being bypassed by the bypass flow path 21 (ON state of a filter bypass).

Further, at the timing of the time T0, since the first flow rate regulator 23*a* and the second flow rate regulator 23*b* are in a closed state (OFF state), and nothing is stored in the tank 14, OFF signals are output from the first liquid level sensor S1 and the second liquid level sensor S2.

Then, in time T1 when the phosphoric acid aqueous solution is supplied in a predetermined amount to the tank 14, the controller 3 operates (turns ON) the first pump 16 to form the circulation flow in the circulation path 15.

Next, when the liquid level of the phosphoric acid aqueous solution stored in the tank 14 gradually rises and becomes equal to or higher than a predetermined second height at time T2, an ON signal is output from the second liquid level sensor S2. Then, the controller 3 operates (turns ON) the precipitation inhibitor supply 12 from the time T2 to supply the precipitation inhibitor to the tank 14, and stops (turns OFF) the phosphoric acid aqueous solution supply 11.

Next, at time T3 when the precipitation inhibitor is supplied in a predetermined amount to the tank 14, the controller 3 stops (turns OFF) the precipitation inhibitor supply 12, and operates (turns ON) the phosphoric acid aqueous solution supply 11 to supply the phosphoric acid aqueous solution to the tank 14.

Next, when the liquid level of the mixed liquid M becomes equal to or higher than a predetermined first height at time T4, an ON signal is output from the first liquid level sensor S1. Then, the controller 3 regards that the phosphoric acid aqueous solution has been supplied in a predetermined amount to the tank 14, and stops (turns OFF) the phosphoric acid aqueous solution supply 11 at the time T4.

As a result, the mixing process is completed, and the mixed liquid M with the first concentration as the phosphoric acid concentration is produced in the mixing device 10. The first concentration is, for example, about 80 (mass %).

As described above, the controller 3 operates the first pump 16 before the precipitation inhibitor is supplied to the tank 14. As a result, the circulation flow may be formed in the circulation path 15 before the precipitation inhibitor is supplied, so that the mixing performance of the phosphoric acid aqueous solution and the precipitation inhibitor may be improved.

Further, the controller 3 supplies the phosphoric acid aqueous solution and the precipitation inhibitor individually to the tank 14, rather than supplying the phosphoric acid aqueous solution and the precipitation inhibitor to the tank 14 at the same time. As a result, an ON signal may be suppressed from being output from the first liquid level sensor S1 before the precipitation inhibitor is supplied in a predetermined amount. Thus, according to the embodiment, the precipitation inhibitor may be reliably supplied in a predetermined amount to the tank 14.

Subsequently, the controller 3 starts the concentration regulating process by operating (turning ON) the first heater 19 from the time T4 to heat the mixed liquid M that circulates in the circulation path 15. The controller 3 heats the mixed liquid M with the first heater 19, so as to heat the mixed liquid M stored in the tank 14.

As a result, the controller 3 evaporates the mixed liquid M in the mixing device 10, so as to regulate the phosphoric acid concentration of the mixed liquid M from the first concentration to a third concentration. That is, the third concentration is higher than the first concentration.

The third concentration is, for example, about 90 mass %. Then, the concentration regulating process is completed at time T5 when the phosphoric acid concentration of the mixed liquid M reaches the third concentration.

In this way, in the embodiment, the first heater 19 is provided in the circulation path 15 of the mixing device 10, so that the mixed liquid M may be efficiently heated, and the concentration of the mixed liquid M may be efficiently regulated.

Further, in the substrate processing according to the embodiment, the concentration regulating process (heating process) is started after the mixing process is completed. This is because when the precipitation inhibitor that contains an organic solvent is supplied to the heated phosphoric acid aqueous solution, the precipitation inhibitor may suddenly boil up.

That is, according to the embodiment, the concentration regulating process (heating process) is started after the mixing process is completed, so that the precipitation inhibitor may be suppressed from suddenly boiling up when the precipitation inhibitor is supplied.

Subsequently, the controller 3 starts the filtration process by turning OFF the filter bypass from time T5 from the time T5. That is, the controller 3 changes the opening/closing valve 21*a* to the closed state from the time T5, to form the circulation flow that flows through the filter 18, in the circulation path 15.

As a result, contaminants such as particles included in the mixed liquid M are removed. Then, the filtration process is completed at time T6 when the contaminants such as particles included in the mixed liquid M are sufficiently removed.

Further, the controller 3 stops (turns OFF) the first heater 19 at the time T6 when the filtration process is completed. As a result, the phosphoric acid concentration of the mixed liquid M in the mixing device 10 may be suppressed from becoming higher than the third concentration.

Further, in the substrate processing according to the embodiment, the filter bypass is turned ON during the mixing process and the concentration regulating process. As a result, the pressure loss that occurs in the filter 18 may be reduced, so that the mixed liquid M stored in the tank 14 may be efficiently circulated in the circulation path 15.

Further, since it is unnecessary to filter the mixed liquid M with the filter 18 until the concentration regulating process is completed, no significant problem occurs even though the mixed liquid M circulates through the bypass flow path 21.

Subsequently, the controller 3 starts the liquid feeding process from the time T6. Specifically, the controller 3 opens (turns ON) the first flow rate regulator 23*a* from the time T6. The second flow rate regulator 23*b* is maintained in the closed state. Further, although not illustrated in, for example, FIG. 2, the controller 3 changes the valve 20 of the circulation path 15 from the open state to the closed state at the time T6.

Thus, the controller 3 feeds the mixed liquid M from the mixing device 10 to the inner tank 31*a* of the substrate processing unit 30 through the circulation path 15 and the first liquid feeding path 22*a*. Further, as illustrated in FIG. 3, the controller 3 operates (turns ON) a stirring mechanism (e.g., a bubbling mechanism; not illustrated in FIG. 1) provided in the inner tank 31a from the time T6.

Then, when the liquid feeding process to the processing container 31 is started so that the mixed liquid M increases in the outer tank 31b, the liquid level of the mixed liquid M stored in the outer tank 31b becomes equal to or higher than a predetermined third height at time T7. As a result, an ON signal is output from the third liquid level sensor S3.

Next, at time T8 when the mixed liquid M is supplied in a predetermined amount to the processing container 31, the controller 3 stops (turns OFF) the first pump 16, and closes (turns OFF) the first flow rate regulator 23a. As a result, the supply of the mixed liquid M to the processing container 31 is stopped, and the liquid feeding process is completed. Further, the controller 3 turns ON the filter bypass at the time T8.

Subsequently, the controller 3 starts the adding process of the silicon solution from the time T8. First, the controller 3 operates (turns ON) the second pump 39 and the second heater 41 of the circulation path 32 from the time T8.

In this way, by heating the mixed liquid M while circulating the mixed liquid M in the circulation path 32, the controller 3 regulates the temperature and the phosphoric acid concentration of the mixed liquid M in the processing container 31 to predetermined values.

Next, at time T9 when the temperature and the phosphoric acid concentration of the mixed liquid M in the processing container 31 reach the predetermined values (temperature and concentration sensors: ON), the controller 3 stops (turns OFF) the stirring mechanism of the processing container 31. As a result, the controller 3 stabilizes the liquid level of the mixed liquid M stored in the inner tank 31a.

Next, at time T10 when a predetermined time elapses from the time T9 so that the liquid level of the mixed liquid M stored in the inner tank 31a is stabilized, the controller 3 operates (turns ON) the processing liquid discharge unit 34. As a result, the controller 3 drops the liquid level of the mixed liquid M stored in the outer tank 31b.

Next, at time T11 when the liquid level of the mixed liquid M stored in the outer tank 31b becomes lower than the predetermined third height, and an OFF signal is output from the third liquid level sensor S3, the controller 3 stops (turns OFF) the processing liquid discharge unit 34.

Here, since the liquid level of the mixed liquid M in the outer tank 31b becomes substantially equal to the predetermined third height, and the inner tank 31a is filled with the mixed liquid M, the controller 3 may weigh the mixed liquid M stored in the entire processing container 31 to a predetermined value. Thus, according to the embodiment, the amount of the mixed liquid M may be accurately regulated when the etching liquid E is produced.

Next, at time T11 when the mixed liquid M is supplied in a predetermined amount to the processing container 31, the controller 3 operates (turns ON) the silicon solution supply 25, and operates (turns ON) the stirring mechanism of the processing container 31. As a result, the controller 3 feeds the silicon solution to the inner tank 31a of the substrate processing unit 30 through the silicon solution supply path 25b.

Then, when the liquid amount in the outer tank 31b increases, the liquid level of the mixed liquid M stored in the outer tank 31b becomes equal to or higher than the predetermined third height at time T12. As a result, an ON signal is output from the third liquid level sensor S3.

Next, at time T13 when the silicon solution is fed in the predetermined amount, the controller 3 stops (turns OFF) the silicon solution supply 25. Further, the controller 3 operates the stirring mechanism of the processing container 31 from the time T13 to time T14 when a predetermined time elapses from the time T13, and the adding process of the silicon solution is completed.

Through the processes that have been described, the controller 3 may prepare the etching liquid E having a desired silicon concentration in the processing container 31 when the mixed liquid M is fed to the processing container 31 at a first time. Thus, according to the embodiment, it is possible to improve the etching selectivity of the silicon nitride film with respect to the silicon oxide film, from the starting time of the etching on the wafers W.

Further, in the embodiment, the wafers W are etched with the etching liquid E having the third concentration which is the relatively high phosphoric acid concentration, so that the silicon nitride film may be efficiently selectively etched.

Further, in the embodiment, the controller 3 supplies both the mixed liquid M and the silicon solution to the inner tank 31a of the processing container 31. As a result, in the embodiment, the mixed liquid M and the silicon solution may be mixed with each other while causing the overflow from the inner tank 31a into the outer tank 31b, so that the mixing performance of the mixed liquid M and the silicon solution may be improved.

Figure 4:
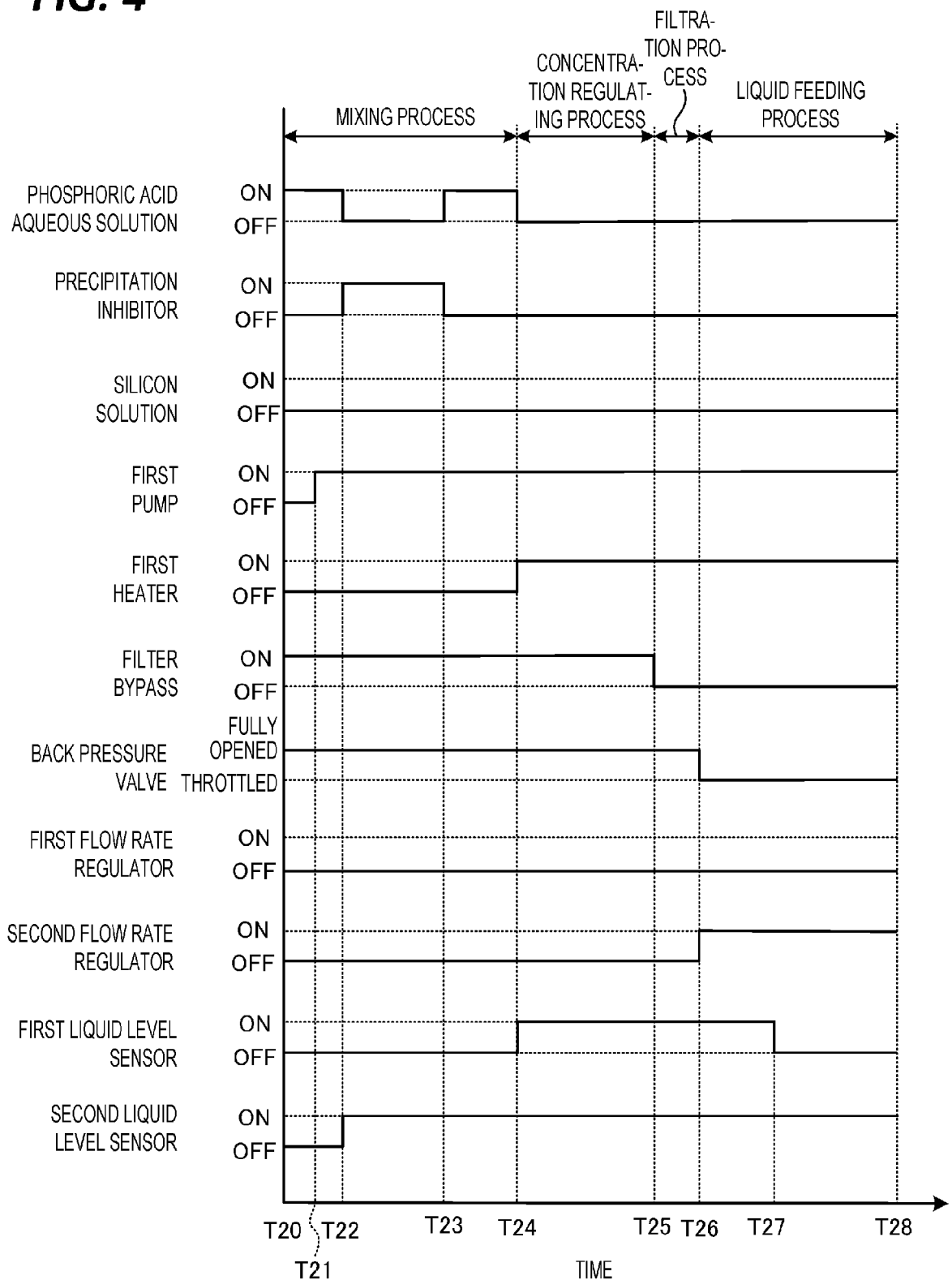
FIG. 4 is a timing chart illustrating a specific example of a behavior pattern of each component of the substrate processing system in various processes performed when a silicon concentration of an etching liquid of the processing container is regulated according to the embodiment.

FIG. 4 is a timing chart illustrating a specific example of a behavior pattern of each component of the substrate processing system 1 in various processes performed when the silicon concentration of the etching liquid E of the processing container 31 is regulated according to the embodiment.

In FIG. 4, descriptions will be made on the preparation of the mixed liquid M to be fed when the etching on the wafers W is started in the processing container 31, and silicon is eluted from the wafers W into the etching liquid E, and the liquid feeding process.

First, the controller 3 starts the mixing process by operating (turning ON) the phosphoric acid aqueous solution supply 11 from time T20 to supply the phosphoric acid aqueous solution to the tank 14.

At the timing of the time T20, the precipitation inhibitor supply 12, the silicon solution supply 25, the first pump 16, and the first heater 19 are not operated (OFF state). Further, at the timing of the time T20, the filter 18 is in a state of being bypassed by the bypass flow path 21 (ON state of the filter bypass), and the back pressure valve 54 is fully opened.

Further, at the timing of the time T20, since the first flow rate regulator 23a and the second flow rate regulator 23b are in the closed state (OFF state), and nothing is stored in the tank 14, OFF signals are output from the first liquid level sensor S1 and the second liquid level sensor S2.

Then, at time T21 when the phosphoric acid aqueous solution is supplied in a predetermined amount to the tank 14, the controller 3 operates (turns ON) the first pump 16 to form the circulation flow in the circulation path 15.

Next, when the liquid level of the phosphoric acid aqueous solution stored in the tank 14 gradually rises and becomes equal to or higher than the predetermined second height at time T22, an ON signal is output from the second liquid level sensor S2. Then, the controller 3 operates (turns ON) the precipitation inhibitor supply 12 from the time T22 to supply the precipitation inhibitor to the tank 14, and stops (turns OFF) the phosphoric acid aqueous solution supply 11.

Next, at time T23 when the precipitation inhibitor is supplied in a predetermined amount to the tank 14, the controller 3 stops (turns OFF) the precipitation inhibitor supply 12, and operates (turns ON) the phosphoric acid aqueous solution supply 11 to supply the phosphoric acid aqueous solution to the tank 14.

Next, when the liquid level of the mixed liquid M becomes equal to or higher than the predetermined first height at time T24, an ON signal is output from the first liquid level sensor S1. Then, the controller 3 regards that the phosphoric acid aqueous solution has been supplied in a predetermined amount to the tank 14, and stops (turns OFF) the phosphoric acid aqueous solution supply 11 at the time T24.

Then, the mixing process is completed, and the mixed liquid M with the first concentration as the phosphoric acid concentration is produced in the mixing device 10.

Subsequently, the controller 3 starts the concentration regulating process by operating (turning ON) the first heater 19 from the time T24 to heat the mixed liquid M that circulates in the circulation path 15. The controller 3 heats the mixed liquid M using the first heater 19, so as to heat the mixed liquid M stored in the tank 14.

As a result, the controller 3 evaporates the mixed liquid M in the mixing device 10, so as to regulate the phosphoric acid concentration of the mixed liquid M from the first concentration to a second concentration. That is, the second concentration is higher than the first concentration.

Further, the second concentration is lower than the third concentration described above, and is, for example, about 85 mass %. Then, the concentration regulating process is completed at time T25 when the phosphoric acid concentration of the mixed liquid M becomes the second concentration.

Subsequently, the controller 3 starts the filtration process by turning OFF the filter bypass from the time T25. As a result, contaminants such as particles included in the mixed liquid M are removed. Then, the filtration process is completed at time T26 when the contaminants such as particles included in the mixed liquid M are sufficiently removed.

Subsequently, the controller 3 starts the liquid feeding process from the time T26. Specifically, the controller 3 opens (turns ON) the second flow rate regulator 23*b* from the time T26, and brings the back pressure valve 54 into a throttled state. The first flow rate regulator 23*b* is maintained in the closed state. Further, although not illustrated in FIG. 4, the controller 3 changes the valve 20 of the circulation path 15 from the open state to the closed state at the time T26.

As a result, the controller 3 feeds the mixed liquid M from the mixing device 10 to the outer tank 31*b* of the substrate processing unit 30 through the circulation path 15 and the second liquid feeding path 22*b*. Then, the mixed liquid M in the tank 14 decreases, and the liquid level of the mixed liquid M becomes lower than the predetermined first height at time T27. As a result, an OFF signal is output from the first liquid level sensor S1.

Here, in the embodiment, the controller 3 performs a control to maintain the silicon concentration in the processing container 31 to be constant or equal to or lower than a certain concentration at all times, based on the silicon concentration of the etching liquid E in the processing container 31 that is obtained from the silicon concentration sensor 42.

For example, when the silicon concentration of the etching liquid E in the processing container 31 becomes higher than a given threshold value, the controller 3 opens the flow rate regulator 34*b* to discharge the etching liquid E having the relatively high silicon concentration and to supply the mixed liquid M in the same amount as the amount of the discharged etching liquid E.

In the embodiment, since the mixing process for the mixed liquid M has been completed in the mixing device 10, the mixed liquid M that contains no silicon solution may be supplied to the processing container 31 as needed.

As a result, the controller 3 may maintain the amount of the etching liquid E stored in the processing container 31 to be constant, and furthermore, may lower the silicon concentration of the etching liquid E in the processing container 31. Thus, according to the embodiment, the silicon concentration in the processing container 31 may be kept constant or equal to or lower than a certain concentration at all times.

Further, in the embodiment, the controller 3 may supply the mixed liquid M that contains no silicon solution to the processing container 31. As a result, when silicon is eluted from the silicon nitride film of the wafers W, and thus, the silicon concentration of the etching liquid E becomes excessive, the silicon concentration of the etching liquid E may be quickly suppressed to a predetermined concentration.

Further, in the embodiment, the silicon solution is individually supplied to the produced mixed liquid M to produce the etching liquid E, so that the silicon concentration of the mixed liquid M supplied to the substrate processing unit 30 may be regulated in a relatively wide range.

That is, when a predetermined silicon concentration is required for the mixed liquid M (e.g., when the mixed liquid is fed at a first time), the silicon solution supply 25 may be operated so that the mixed liquid M that contains the silicon solution may be supplied to the processing container 31.

Meanwhile, when a predetermined silicon concentration is not required for the mixed liquid M (e.g., when the silicon concentration is regulated), the silicon solution supply 25 may not be operated so that the mixed liquid M that contains no silicon solution may be supplied to the processing container 31.

Further, in the embodiment, the concentration of the mixed liquid M used for regulating the silicon concentration of the etching liquid E is regulated to the second concentration higher than the first concentration through the concentration regulating process described above. As a result, as compared with a case where the silicon concentration of the etching liquid E is regulated with the mixed liquid M with the first concentration as the phosphoric acid concentration, the phosphoric acid concentration of the etching liquid E may be suppressed from being lowered largely from the third concentration.

That is, in the embodiment, since the phosphoric acid concentration of the etching liquid E may be further stabilized, the etching of the wafers W with the etching liquid E may be appropriately performed.

Further, in the embodiment, the concentration of the mixed liquid M used for regulating the silicon concentration of the etching liquid E is regulated to the second concentration lower than the third concentration through the concentration regulating process described above. As a result, since the time for the concentration regulating process may be reduced, the mixed liquid M used for regulating the silicon concentration of the etching liquid E may be efficiently prepared.

Further, in the embodiment, the mixed liquid M used for regulating the silicon concentration of the etching liquid E is fed through the second liquid feeding path 22*b* different from the first liquid feeding path 22*a*. As a result, the silicon concentration of the etching liquid E may be regulated without using the mixed liquid M that remains in the first liquid feeding path 22*a* and has the third concentration as the phosphoric acid concentration.

Thus, according to the embodiment, since the phosphoric acid concentration of the etching liquid E may be further stabilized, the etching of the wafers W with the etching liquid E may be more appropriately performed.

Further, in the embodiment, when the silicon concentration of the etching liquid E is regulated, the regulating process is performed while detecting the phosphoric acid concentration of the mixed liquid M that is being fed, with the phosphoric acid concentration sensor 52 of the circulation path 15. That is, in the embodiment, the phosphoric acid concentration sensor 52 feedback-controls the feeding amount of the mixed liquid M.

As a result, since the phosphoric acid concentration of the etching liquid E may be further stabilized, the etching of the wafers W with the etching liquid E may be appropriately performed.

Further, in the embodiment, when the supply of the mixed liquid M to the processing container 31 is unnecessary, the controller 3 may return the mixed liquid M that flows in the second liquid feeding path 22b to the tank 14 through the second return path 24b.

That is, when the supply of the mixed liquid M to the processing container 31 is unnecessary, the controller 3 may change the valve 58 to the closed state, and further, may change the valve 59 to the open state, so as to circulate the mixed liquid M using the circulation path 15, the second liquid feeding path 22b, and the second return path 24b.

As a result, it is possible to align a state where the mixed liquid M is discharged from the second liquid feeding path 22b to the outer tank 31b (i.e., a state where the supply of the mixed liquid M is necessary) and a state where the mixed liquid M is not discharged from the second liquid feeding path 22b to the outer tank 31b (i.e., a state where the supply of the mixed liquid M is unnecessary).

Thus, according to the embodiment, since the mixed liquid M may be more accurately discharged, the process of maintaining the silicon concentration in the processing container 31 to be constant or equal to or lower than a certain concentration may be more accurately performed.

Further, in the embodiment, the mixed liquid M that flows in the second liquid feeding path 22b may also be returned to the tank 14 through the first return path 24a, as well as the second return path 24b.

As a result, the flow rate of the mixed liquid M that flows in the second liquid feeding path 22b may be increased, so that the minimum flow rate of the mixed liquid M required when the mixed liquid M is heated by the first heater 19 may be secured. Thus, according to the embodiment, the mixed liquid M may be stably heated.

Further, in the embodiment, the controller 3 may bring the back pressure valve 54 into a throttled state during the liquid feeding process for feeding the mixed liquid M. As a result, the controller 3 may increase the pressure of the branch portion 22b1 in the second liquid feeding path 22b, so that it is possible to secure the pressure required to return the mixed liquid M from the branch portion 22b1 to the tank 14 through the second liquid feeding path 22b and the second return path 24b.

In the embodiment, when the flow rate of the mixed liquid M discharged from the second liquid feed path 22b to the outer tank 31b is regulated, the flow rate is roughly regulated using the throttle valve 57, and finely regulated using the flow meter 55 and the constant pressure valve 56.

Here, in the embodiment, the pressure of the mixed liquid M in the flow meter 55 may be feedback-controlled using the constant pressure valve 56, so as to maintain the flow rate of the mixed liquid M in the flow meter 55 to be constant. As a result, the mixed liquid M may be discharged in a more accurate amount, so that the process of maintaining the silicon concentration in the processing container 31 to be constant or equal to or lower than a certain concentration may be more accurately performed.

In the embodiment, when the silicon concentration of the etching liquid E is regulated, the controller 3 may supply the mixed liquid M to the outer tank 31b, rather than the inner tank 31a. As a result, it is possible to suppress a sudden change in silicon concentration of the etching liquid E of the inner tank 31a, as compared with a case where the mixed liquid M is directly supplied to the inner tank 31a in which the wafers W are processed.

Thus, according to the embodiment, the etching of the wafers W may be more stably performed.

Further, in the embodiment, the liquid feeding paths 22 (the first liquid feeding path 22a and the second liquid feeding path 22b) are branched from the circulation path 15. As a result, the mixed liquid M may be fed to the processing container 31 by the first pump 16 used when the mixing process or the concentration regulating process is performed.

That is, in the embodiment, since it is unnecessary to separately provide a pump in the liquid feeding paths 22 for the liquid feeding process for feeding the mixed liquid M, so that the mixed liquid M may be fed at low costs.

Figure 5:
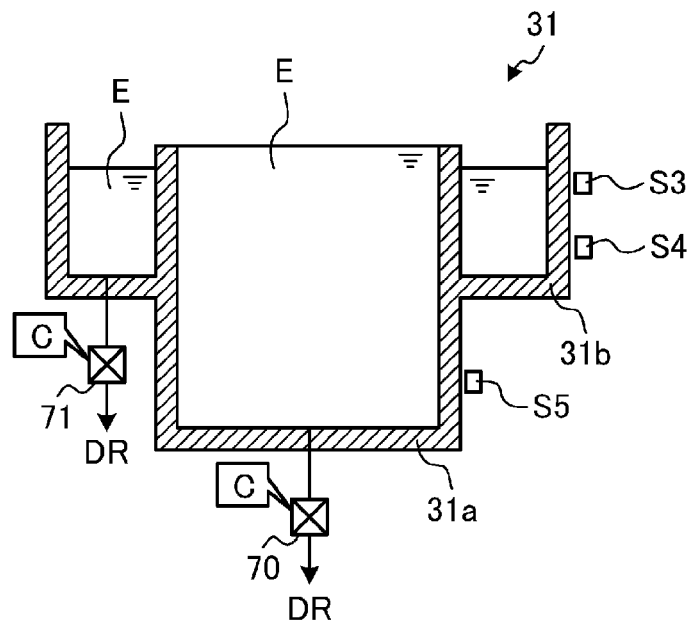
FIG. 5 is a view illustrating details of a process of replacing the etching liquid in the processing container according to the embodiment.
Figure 6:
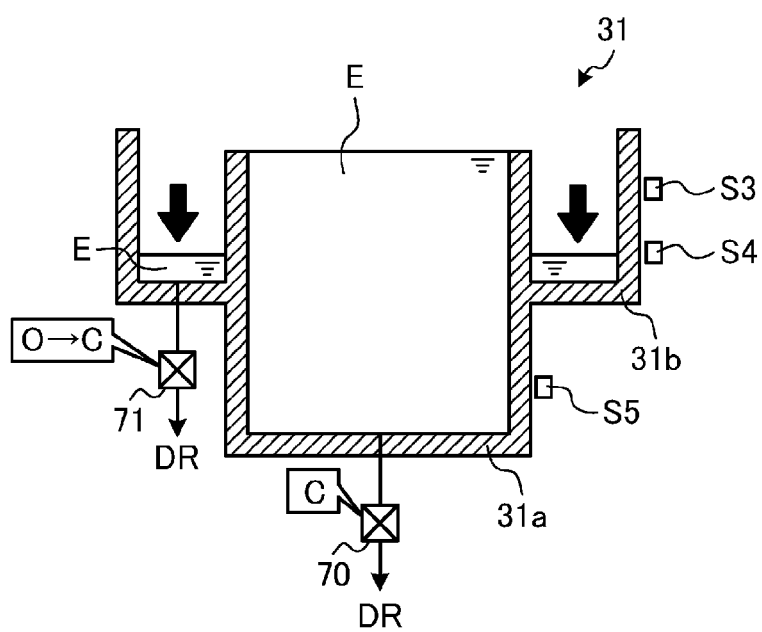
FIG. 6 is a view illustrating details of the process of replacing the etching liquid in the processing container according to the embodiment.
Figure 7:
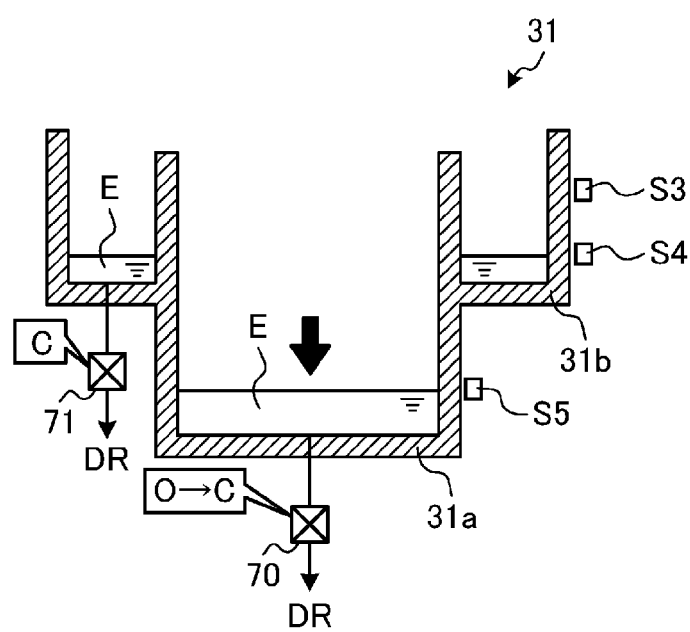
FIG. 7 is a view illustrating details of the process of replacing the etching liquid in the processing container according to the embodiment.

FIGS. 5 to 7 are views illustrating details of a process of replacing the etching liquid E in the processing container 31 according to the embodiment. Especially, FIG. 5 is a view illustrating a state immediately before the etching liquid E in the processing container 31 is replaced.

As illustrated in FIG. 5, the processing container 31 according to the embodiment includes a fourth liquid level sensor S4 and a fifth liquid level sensor S5, in addition to the third liquid level sensor S3 described above. The fourth liquid level sensor S4 is provided in the outer tank 31b, and the fifth liquid level sensor S5 is provided in the inner tank 31a.

As a result, the height of the liquid level of the mixed liquid M or the etching liquid E that is stored in the outer tank 31b and the inner tank 31a is controlled. The fourth liquid level sensor S4 is provided near the bottom of the outer tank 31b below the third liquid level sensor S3. The fifth liquid level sensor S5 is provided near the bottom of the inner tank 31a.

Further, the bottom of the inner tank 31a is connected to a drain DR via a discharge valve 70, and the bottom of the outer tank 31b is connected to a drain DR via a discharge valve 71. By opening the discharge valves 70 and 71, the controller 3 may discharge the mixed liquid M or the etching liquid E that is stored in the inner tank 31a and the outer tank 31b.

Then, as illustrated in FIG. 5, both the discharge valves 70 and 71 are in the closed state (indicated as "C" in FIG. 5) immediately before the etching liquid E in the processing container 31 is replaced, and the etching liquid E is stored in the inner tank 31a and the outer tank 31b in an amount necessary for the processing of the wafers W (see FIG. 1).

In the process of replacing the etching liquid E in the processing container 31 according to the embodiment, the controller 3 first changes the closed state of the discharge valve 71 to the open state as illustrated in FIG. 6 (indicated as "O" in FIG. 6).

Then, the liquid level of the etching liquid E stored in the outer tank 31b gradually drops, and when the liquid level becomes lower than a predetermined fourth height near the bottom of the outer tank 31b, an OFF signal is output from the fourth liquid level sensor S4.

Then, when the OFF signal is output from the fourth liquid level sensor S4, the controller 3 changes the open state of the discharge valve 71 to the closed state. As a result, the controller 3 may set the amount of the etching liquid E that remains in the outer tank 31b to a constant value.

Next, as illustrated in FIG. 7, the controller 3 changes the closed state of the discharge valve 70 to the open state. Then, the liquid level of the etching liquid E stored in the inner tank 31a gradually drops, and when the liquid level becomes lower than a predetermined fifth height near the bottom of the inner tank 31a, an OFF signal is output from the fifth liquid level sensor S5.

Then, when the OFF signal is output from the fifth liquid level sensor S5, the controller 3 changes the open state of the discharge valve 70 to the closed state. As a result, the controller 3 may set the amount of the etching liquid E that remains in the inner tank 31a to a constant value.

Then, as illustrated in FIG. 7, the controller 3 performs the liquid feeding process and the adding process which are illustrated in FIGS. 2 and 3, for the processing container 31 in which the etching liquid E remains.

Here, in a case where it is attempted to thoroughly discharge the etching liquid E without leaving a certain amount of the etching liquid E in the inner tank 31a and the outer tank 31b, the amount of the etching liquid E that remains in a pipe, a pump or the like without being discharged may vary.

Further, in a case where the liquid feeding process or the adding process illustrated in FIGS. 2 and 3 is performed for the processing container 31 in which the remaining amount of the etching liquid E is varying, the amount of silicon that remains in the processing container 31 is varying, and as a result, the silicon concentration of the etching liquid E to be newly produced also varies. Accordingly, in this case, it becomes difficult to appropriately perform the etching of the wafers W with the etching liquid E.

Meanwhile, in the embodiment, since the amount of the etching liquid E that remains in the processing container 31 may be set to a constant value by the processes illustrated in FIGS. 5 to 7, the amount of silicon that remains in the processing container 31 may be set to a constant value.

That is, in the embodiment, the silicon concentration of the etching liquid E to be newly produced may be set to a desired value. Thus, according to the embodiment, the etching of the wafers W may be more appropriately performed with the etching liquid E.

FIGS. 5 to 7 illustrate an example where the etching liquid E of the outer tank 31b is first discharged, and then, the etching liquid E of the inner tank 31a is discharged. However, the order of discharging the etching liquid E from the processing container 31 is not limited to the example.

For example, the etching liquid E of the inner tank 31a may be first discharged, and then, the etching liquid E of the outer tank 31b may be discharged, or the etching liquid E of the inner tank 31a and the etching liquid E of the outer tank 31b may be discharged in parallel.

<Modification 1>

Figure 8:
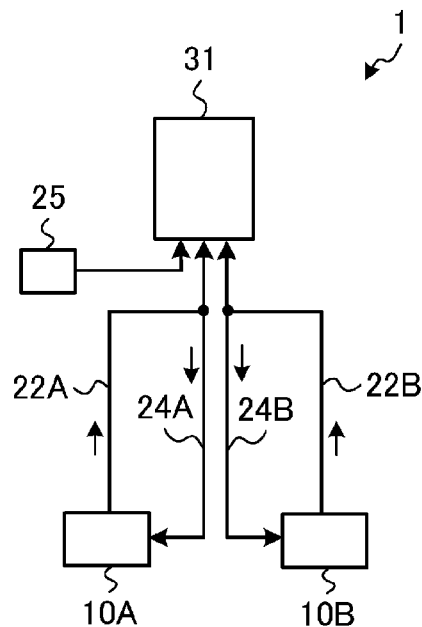
FIG. 8 is a schematic block diagram illustrating a configuration of a substrate processing system according to Modification 1 of the embodiment.

Subsequently, various modifications of the substrate processing system 1 according to the embodiment will be described with reference to FIGS. 8 to 11. FIG. 8 is a schematic block diagram illustrating a configuration of a substrate processing system 1 according to Modification 1 of the embodiment. In the various modifications described herein below, similar portions to those in the embodiment will be denoted by the same reference numerals as used in the embodiment, and overlapping descriptions will be omitted.

In the substrate processing system 1 according to Modification 1, a plurality of mixing devices 10 (see, e.g., FIG. 1) is provided for one processing container 31. In the example of FIG. 8, two mixing devices 10A and 10B are provided for one processing container 31. In the descriptions hereinafter, the plurality of mixing devices 10A and 10B may be collectively referred to as a "mixing device 10."

A liquid feeding path 22A is connected between the mixing device 10A and the processing container 31, and the mixed liquid M is fed from the mixing device 10A to the processing container 31 through the liquid feeding path 22A. Further, the mixed liquid M is returned to the tank 14 (see, e.g., FIG. 1) of the mixing device 10A through a return path 24A connected to the liquid feeding path 22A.

A liquid feeding path 22B is connected between the mixing device 10B and the processing container 31, and the mixed liquid M is fed from the mixing device 10B to the processing container 31 through the liquid feeding path 22B. Further, the mixed liquid M is returned to the tank 14 of the mixing device 10B through a return path 24B connected to the liquid feeding path 22B.

In Modification 1, each of the liquid feeding paths 22A and 22B includes the first liquid feeding path 22a and the second liquid feeding path 22b illustrated in FIG. 1, and each of the return paths 24A and 24B includes the first return path 24a and the second return path 24b illustrated in FIG. 1.

The silicon solution supply 25 is connected to the processing container 31, and the silicon solution is supplied to the processing container 31 via the silicon solution supply 25.

Figure 9:
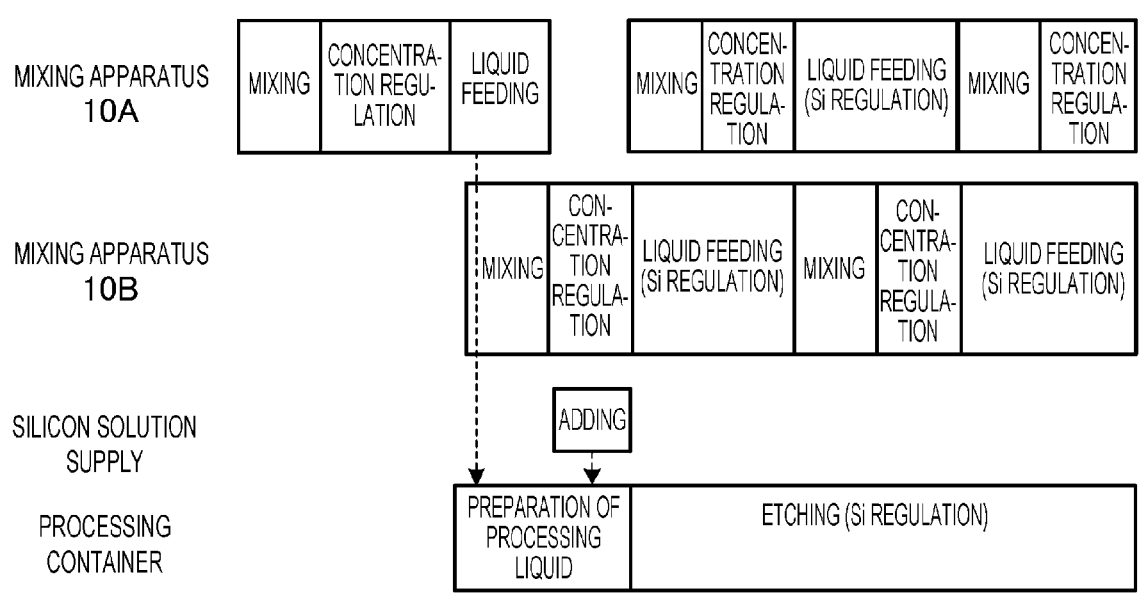
FIG. 9 is a view illustrating a specific example of a flow of processes performed by each component of the substrate processing system according to Modification 1 of the embodiment.

FIG. 9 is a view illustrating a specific example of the flow of the processes performed by each component of the substrate processing system 1 according to Modification 1 of the embodiment.

As illustrated in FIG. 9, the controller 3 (see, e.g., FIG. 1) first performs the mixing process (indicated as "mixing" in the subsequent drawings), the concentration regulating process (indicated as "concentration regulation" in the subsequent drawings), and the filtration process (not illustrated in FIG. 9) which are illustrated in FIG. 2, in an order in the mixing device 10A. As a result, the controller 3 prepares the mixed liquid M with the third concentration as the phosphoric acid concentration in the mixing device 10A.

Next, the controller 3 feeds the mixed liquid M with the third concentration as the phosphoric acid concentration from the mixing device 10A to the processing container 31 (indicated as "liquid feeding" in the subsequent drawings). Then, when the liquid feeding process for feeding the mixed liquid M from the mixing device 10A is completed, the controller 3 supplies the silicon solution from the silicon solution supply 25 to the processing container 31, to perform the adding process for adding the silicon solution illustrated in FIG. 3 (indicated as "adding" in the subsequent drawings).

Through the various processes that have been described, the etching liquid E that has the third concentration as the phosphoric acid concentration and the desired silicon concentration is prepared in the processing container 31.

Further, in parallel with the various processes of the mixing device 10A and the silicon solution supply 25, the controller 3 performs the mixing process, the concentration regulating process, and the filtration process (not illustrated) which are illustrated in FIG. 4, in an order in the mixing device 10B. As a result, the controller 3 prepares the mixed liquid M with the second concentration as the phosphoric acid concentration in the mixing device 10B.

Next, the controller 3 immerses the wafers W in the processing container 31, and performs the etching on the wafers W. During the etching, the controller 3 feeds the mixed liquid M with the second concentration as the phosphoric acid concentration from the mixing device 10B, to perform the process of maintaining the silicon concentration in the processing container 31 to be constant or equal to or lower than a certain concentration (hereinafter, also referred to as the "silicon regulating process").

Further, in parallel with the liquid feeding process in the mixing device 10B, the controller 3 performs the mixing process, the concentration regulating process, and the filtration process (not illustrated) which are illustrated in FIG. 4, in an order in the mixing device 10A in which the liquid feeding process has been completed once. As a result, the controller 3 prepares the mixed liquid M with the second concentration as the phosphoric acid concentration in the mixing device 10A.

Then, at a timing when the mixed liquid M in the mixing device 10B is exhausted, and the liquid feeding process in the mixing device 10B is completed, the controller 3 feeds the mixed liquid M with the second concentration as the phosphoric acid concentration from the mixing device 10A, so as to continue the silicon regulating process in the processing container 31.

Further, in parallel with the liquid feeding process in the mixing device 10A, the controller 3 performs the mixing process, the concentration regulating process, and the filtration process (not illustrated) which are illustrated in FIG. 4, in an order in the mixing device 10B. As a result, the controller 3 prepares the mixed liquid M with the second concentration as the phosphoric acid concentration in the mixing device 10B.

Then, at a timing when the mixed liquid M in the mixing device 10A is exhausted, and the liquid feeding process in the mixing device 10A is completed, the controller 3 feeds the mixed liquid M with the second concentration as the phosphoric acid concentration from the mixing device 10B, so as to continue the silicon regulating process in the processing container 31.

As described above, in Modification 1, the mixed liquid M is sequentially fed from one of the plurality of mixing devices 10 to one processing container 31 in which the etching is performed, and the other mixing device 10 prepares the mixed liquid M with the second concentration as the phosphoric acid concentration.

As a result, the silicon regulating process may be continuously performed in one processing container 31. Thus, according to Modification 1, the etching of the wafers W with the etching liquid E may be more appropriately performed in one processing container 31.

While Modification 1 represents an example where two mixing devices 10 are provided for one processing container 31, the number of mixing devices 10 provided for one processing container 31 is not limited to two.

<Modification 2>

Figure 10:
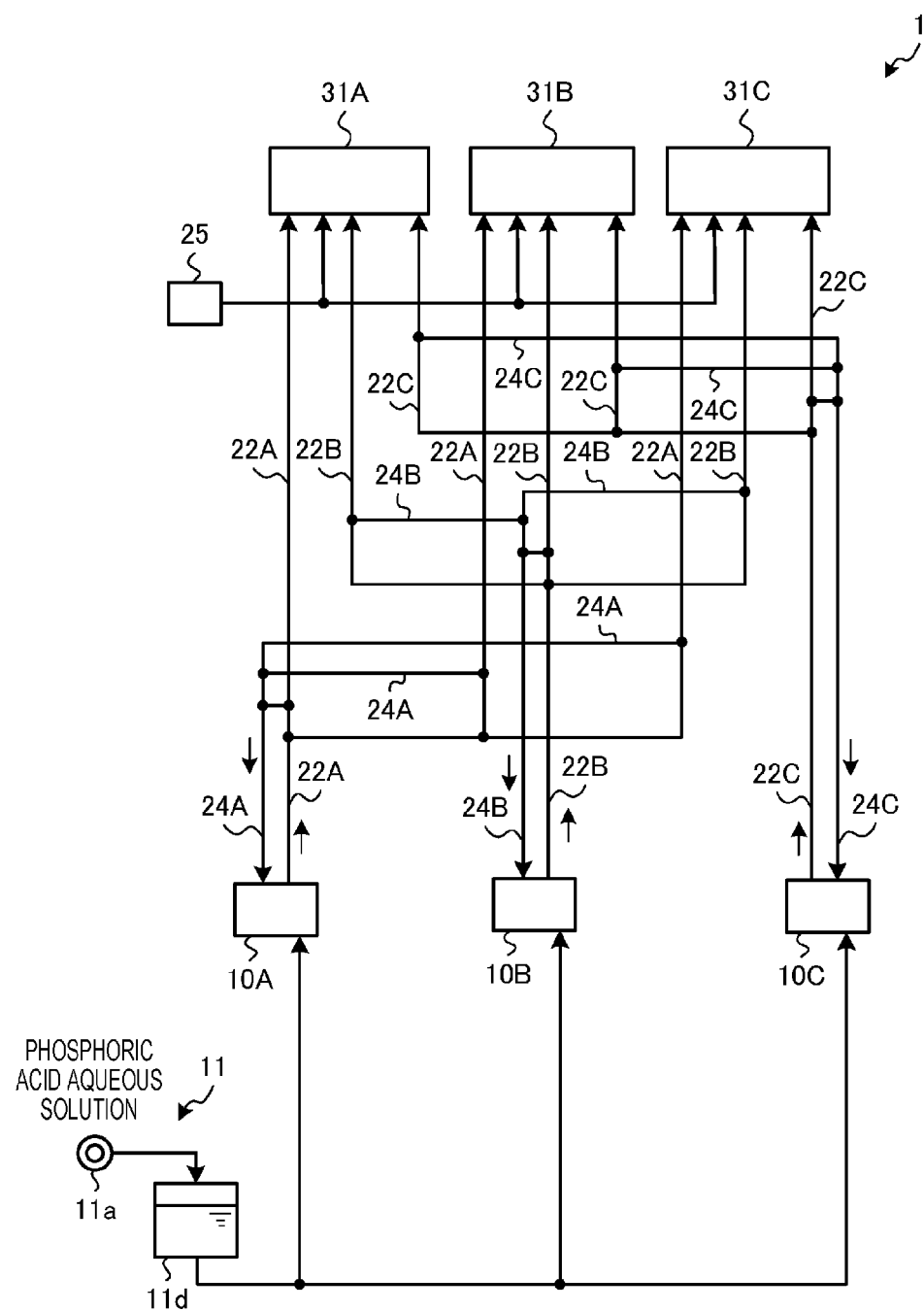
FIG. 10 is a schematic block diagram illustrating a configuration of a substrate processing system according to Modification 2 of the embodiment.

FIG. 10 is a schematic block diagram illustrating a configuration of a substrate processing system 1 according to Modification 2 of the embodiment. In the substrate processing system 1 according to Modification 2, a plurality of mixing devices 10 (see, e.g., FIG. 1) is provided for a plurality of processing containers 31 (see, e.g., FIG. 1).

In the example of FIG. 10, three mixing devices 10A to 10C are provided for three processing containers 31. In the descriptions hereinafter, the plurality of mixing devices 10A to 10C may be collectively referred to as a "mixing device 10," and the plurality of processing containers 31A to 31C may be collectively referred to as a "processing container 31."

Three branched liquid feeding paths 22A are each connected between the mixing device 10A and each of the processing containers 31A to 31C, and the mixed liquid M is individually fed from the mixing device 10A to the processing containers 31A to 31C through the liquid feeding paths 22A.

Further, the mixed liquid M is returned to the tank 14 (see, e.g., FIG. 1) of the mixing device 10A through return paths 24A connected to the three branched liquid feeding paths 22A, respectively.

Three branched liquid feeding paths 22B are each connected between the mixing device 10B and each of the processing containers 31A to 31C, and the mixed liquid M is individually fed from the mixing device 10B to the processing containers 31A to 31C through the liquid feeding paths 22B.

Further, the mixed liquid M is returned to the tank 14 of the mixing device 10B through return paths 24B connected to the three branched liquid feeding paths 22B, respectively.

Three branched liquid feeding paths 22C are each connected between the mixing device 10C and each of the processing containers 31A to 31C, and the mixed liquid M is individually fed from the mixing device 10C to the processing containers 31A to 31C through the liquid feeding paths 22C.

Further, the mixed liquid M is returned to the tank 14 of the mixing device 10C through return paths 24C connected to the three branched liquid feeding paths 22C.

In Modification 2, each of the liquid feeding paths 22A to 22C includes the first liquid feeding path 22a and the second liquid feeding path 22b illustrated in FIG. 1, and each of the return paths 24A to 24C includes the first return path 24a and the second return path 24b illustrated in FIG. 1.

Further, the silicon solution supply 25 is connected to each of the processing containers 31A to 31C, and the silicon solution is individually supplied to the processing containers 31A to 31C via the silicon solution supply 25.

In the phosphoric acid aqueous solution supply 11 that supplies the phosphoric acid aqueous solution to the mixing devices 10A to 10C, a buffer tank 11d is provided downstream from the phosphoric acid aqueous solution supply source 11a. In Modification 2, by providing the buffer tank 11d, the phosphoric acid aqueous solution used in the plurality of mixing devices 10A to 10C may be sufficiently supplied in a required amount at a required timing.

In Modification 2, when the phosphoric acid aqueous solution supply 11 has a capacity of sufficiently supplying the phosphoric acid aqueous solution, the buffer tank 11d may not necessarily be provided in the phosphoric acid aqueous solution supply 11.

Figure 11:
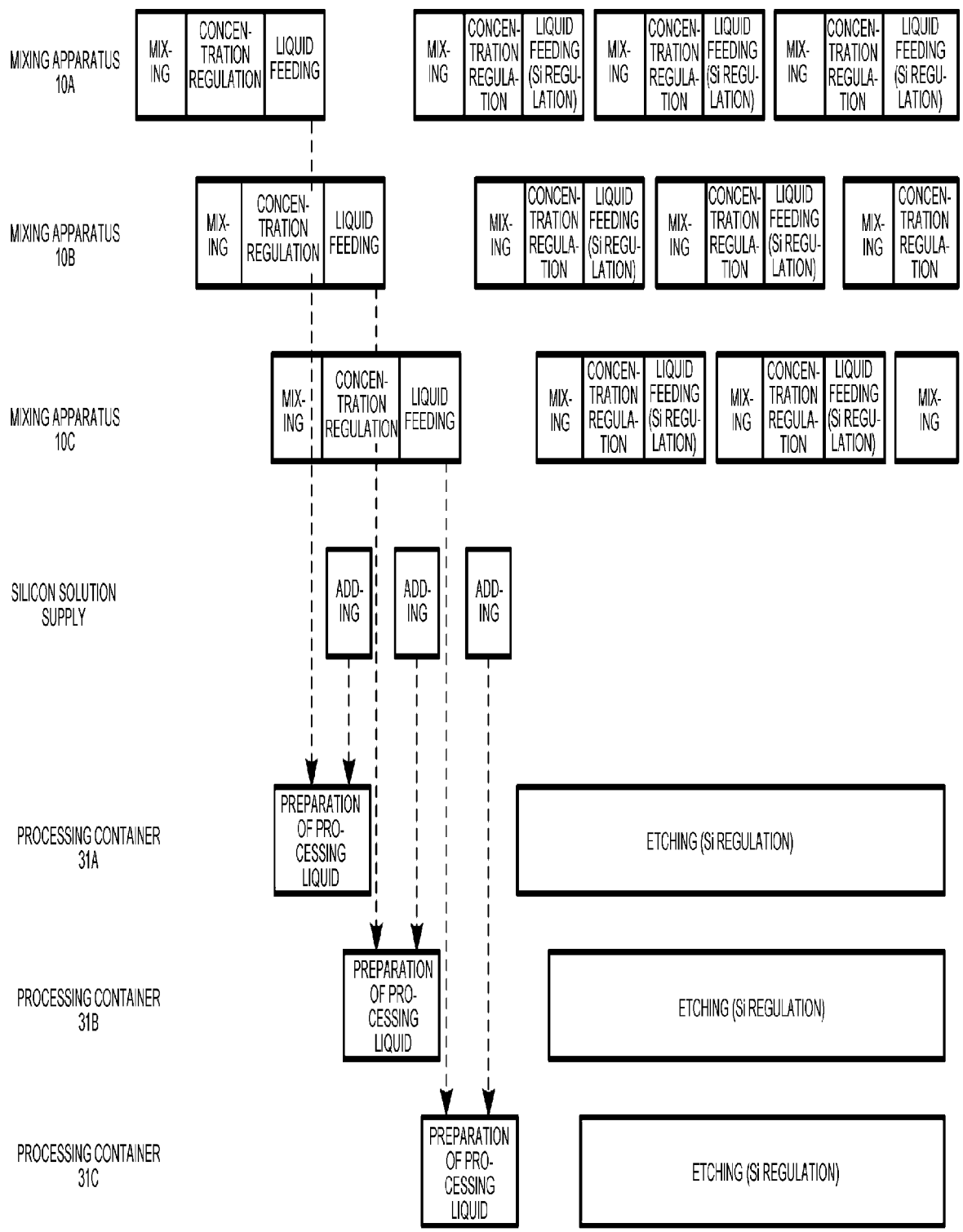
FIG. 11 is a view illustrating a specific example of a flow of processes performed by each component of the substrate processing system according to Modification 2 of the embodiment.

FIG. 11 is a view illustrating a specific example of the flow of the processes performed by each component of the substrate processing system 1 according to Modification 2 of the embodiment.

As illustrated in FIG. 11, the controller 3 (see, e.g., FIG. 1) first performs the mixing process, the concentration regulating process, and the filtration process (not illustrated in FIG. 11) which are illustrated in FIG. 2, in an order in the mixing device 10A. As a result, the controller 3 prepares the mixed liquid M with the third concentration as the phosphoric acid concentration in the mixing device 10A.

Next, the controller 3 feeds the mixed liquid M with the third concentration as the phosphoric acid concentration from the mixing device 10A to the processing container 31A. Then, when the liquid feeding process for feeding the mixed liquid M from the mixing device 10A is completed, the controller 3 supplies the silicon solution from the silicon solution supply 25 to the processing container 31A, to perform the adding process for adding the silicon solution as illustrated in FIG. 3.

Through the various processes that have been described, the etching liquid E that has the third concentration as the phosphoric acid concentration and the desired silicon concentration is prepared in the processing container 31A.

Further, in parallel with the various processes of the mixing device 10A and the silicon solution supply 25, the controller 3 performs the mixing process, the concentration regulating process, and the filtration process (not illustrated in FIG. 11) which are illustrated in FIG. 2, in an order in the mixing device 10B. As a result, the controller 3 prepares the mixed liquid M with the third concentration as the phosphoric acid concentration in the mixing device 10B.

Next, the controller 3 feeds the mixed liquid M with the third concentration as the phosphoric acid concentration from the mixing device 10B to the processing container 31B. Then, when the liquid feeding process for feeding the mixed liquid M from the mixing device 10B is completed, the controller 3 supplies the silicon solution from the silicon solution supply 25 to the processing container 31B, to perform the adding process for adding the silicon solution as illustrated in FIG. 3.

Through the various processes that have been described, the etching liquid E that has the third concentration as the phosphoric acid concentration and the desired silicon concentration is prepared in the processing container 31B.

Further, in parallel with the various processes of the mixing devices 10A and 10B and the silicon solution supply 25, the controller 3 performs the mixing process, the concentration regulating process, and the filtration process (not illustrated in FIG. 11) which are illustrated in FIG. 2, in an order in the mixing device 10C. As a result, the controller 3 prepares the mixed liquid M with the third concentration as the phosphoric acid concentration in the mixing device 10C.

Next, the controller 3 feeds the mixed liquid M with the third concentration as the phosphoric acid concentration from the mixing device 10C to the processing container 31C. Then, when the liquid feeding process for feeding the mixed liquid M from the mixing device 10C is completed, the controller 3 supplies the silicon solution from the silicon solution supply 25 to the processing container 31C, to perform the adding process for adding the silicon solution as illustrated in FIG. 3.

Through the various processes that have been described, the etching liquid E that hast the third concentration as the phosphoric acid concentration and the desired silicon concentration is prepared in the processing container 31C.

Further, in parallel with the various processes of the mixing devices 10B and 10C and the silicon solution supply 25, the controller 3 performs the mixing process, the concentration regulating process, and the filtration process (not illustrated) which are illustrated in FIG. 4, in an order in the mixing device 10A in which the liquid feeding process has been completed once. As a result, the controller 3 prepares the mixed liquid M with the second concentration as the phosphoric acid concentration in the mixing device 10A.

Next, the controller 3 sequentially immerses the wafers W in the processing containers 31A to 31C, to perform the etching on the wafers W. During the etching, the controller 3 feeds the mixed liquid M with the second concentration as the phosphoric acid concentration from the mixing device 10A, so as to perform the silicon regulating process in the processing containers 31A to 31C.

Further, in parallel with the various processes of the mixing devices 10A and 10C and the silicon solution supply 25, the controller 3 performs the mixing process, the concentration regulating process, and the filtration process (not illustrated) which are illustrated in FIG. 4, in an order in the mixing device 10B in which the liquid feeding process has been completed once. As a result, the controller 3 prepares the mixed liquid M with the second concentration as the phosphoric acid concentration in the mixing device 10B.

Then, at a timing when the mixed liquid M in the mixing device 10A is exhausted, and the liquid feeding process in the mixing device 10A is completed, the controller 3 feeds the mixed liquid M with the second concentration as the phosphoric acid concentration from the mixing device 10B, so as to continue the silicon regulating process in the processing containers 31A to 31C.

Further, in parallel with the various processes of the mixing devices 10A and 10B, the controller 3 performs the mixing process, the concentration regulating process, and the filtration process (not illustrated) which are illustrated in FIG. 4, in an order in the mixing device 10C in which the liquid feeding process has been completed once. As a result, the controller 3 prepares the mixed liquid M with the second concentration as the phosphoric acid concentration in the mixing device 10C.

Then, at a timing when the mixed liquid M in the mixing device 10B is exhausted, and the liquid feeding process in the mixing device 10B is completed, the controller 3 feeds the mixed liquid M with the second concentration as the phosphoric acid concentration from the mixing device 10C, so as to continue the silicon regulating process in the processing containers 31A to 31C.

Further, in parallel with the various processes of the mixing devices 10B and 10C, the controller 3 performs the mixing process, the concentration regulating process, and the filtration process (not illustrated) which are illustrated in FIG. 4, in an order in the mixing device 10A in which the liquid feeding process has been completed. As a result, the controller 3 prepares the mixed liquid M with the second concentration as the phosphoric acid concentration in the mixing device 10A.

Then, at a timing when the mixed liquid M in the mixing device 10C is exhausted, and the liquid feeding process in the mixing device 10C is completed, the controller 3 feeds the mixed liquid M with the second concentration as the phosphoric acid concentration from the mixing device 10A, so as to continue the silicon regulating process in the processing containers 31A to 31C.

As described above, in Modification 2, the mixed liquid M is sequentially fed from each of the plurality of mixing devices 10 to the plurality of processing containers 31 in which the etching is performed, and the other mixing devices 10 prepare the mixed liquid M with the second concentration as the phosphoric acid concentration.

As a result, the silicon regulating process may be continuously performed in the plurality of processing containers 31. Thus, according to Modification 2, the etching of the wafers W with the etching liquid E may be more appropriately performed in the plurality of processing containers 31.

Further, in Modification 2, the etching of the wafers W may be performed in parallel in the plurality of processing containers 31. Thus, according to Modification 2, the etching of the wafers W with the etching liquid E may be efficiently performed.

While Modification 2 represents an example where three mixing devices 10 are provided for three processing containers 31, the number of processing containers 31 is not limited to three, and the number of mixing device 10 is also limited to three.

<Modification 3>

Figure 12:
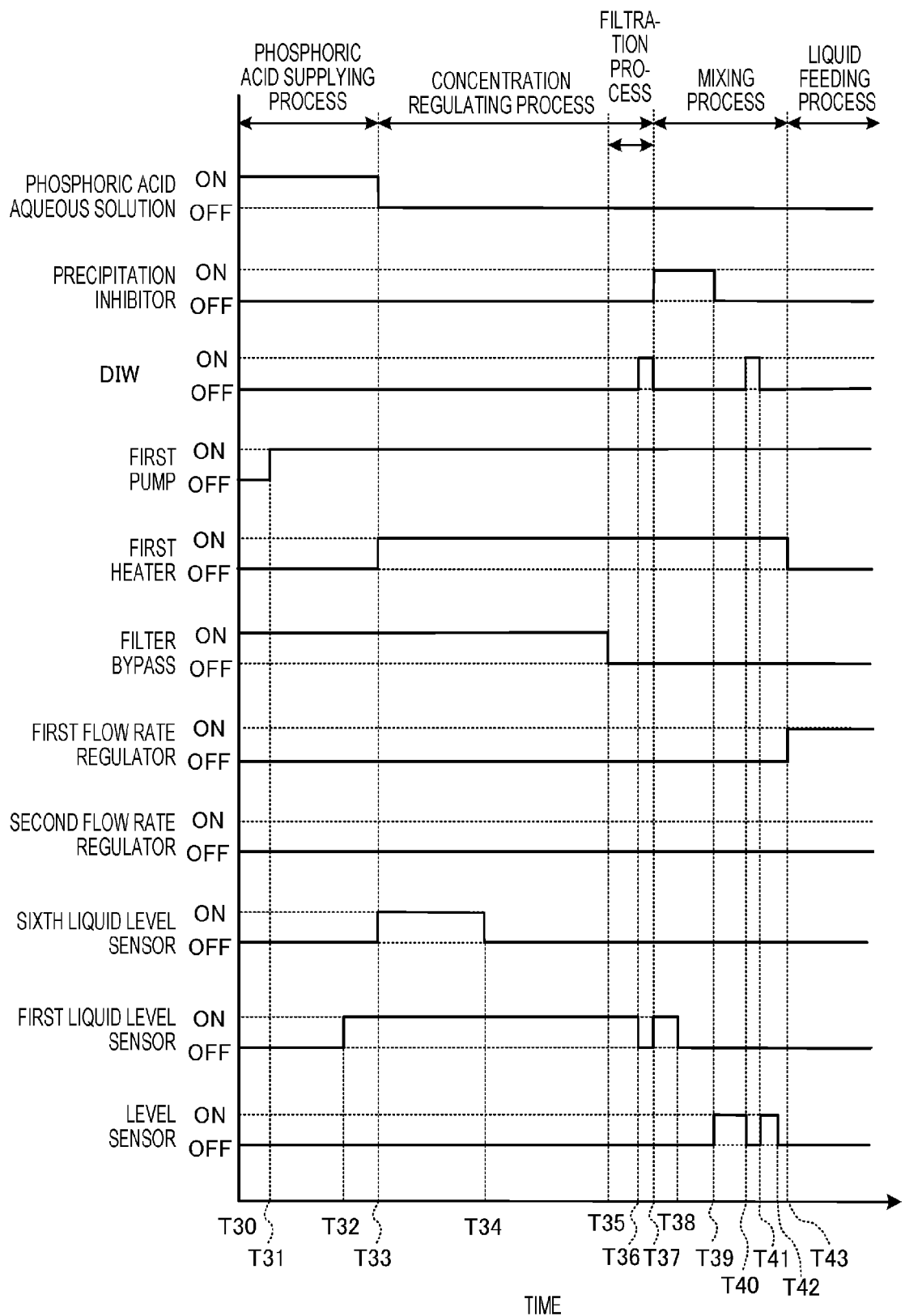
FIG. 12 is a timing chart illustrating a specific example of a behavior pattern of each component of a substrate processing system in various processes performed when a mixed liquid is fed to a processing container at a first time according to Modification 3 of the embodiment.

FIG. 12 is a timing chart illustrating a specific example of a behavior pattern of each component of a substrate processing system 1 in various processes performed when the mixed liquid M is fed to the processing container 31 at a first time according to Modification 3 of the embodiment. Further, FIG. 12 represents the first half of the various processes performed when the mixed liquid M is fed to the processing container 31 at a first time, and corresponds to FIG. 2 of the embodiment.

As illustrated in FIG. 12, in Modification 3, the phosphoric acid supplying process, the concentration regulating process, the filtration process, the mixing process, the liquid feeding process, and the adding process (not illustrated) are performed in an order. First, the controller 3 starts the phosphoric acid supplying process by operating (turning ON) the phosphoric acid aqueous solution supply 11 from time T30 to supply the phosphoric acid aqueous solution to the tank 14.

At the timing of the time T30, the precipitation inhibitor supply 12, the first pump 16, and the first heater 19 are not operated (turned OFF). Further, at the timing of the time T30, since the opening/closing valve 21a is opened, the filter 18 is in a state of being bypassed by the bypass flow path 21 (ON state of the filter bypass).

Further, at the timing of the time T30, since the first flow rate regulator 23a and the second flow rate regulator 23b are in the closed state (OFF state), and nothing is stored in the tank 14, an OFF signal is output from the first liquid level sensor S1.

Further, in Modification 3, a DIW supply (not illustrated) is provided to supply DIW to the tank 14, and a sixth liquid level sensor (not illustrated) is provided at a predetermined height higher than that of the first liquid level sensor S1 (hereinafter, also referred to as a sixth height). Further, in Modification 3, a level sensor (not illustrated) is provided to measure the liquid amount of the processing liquid stored in the tank 14 based on the head pressure at the bottom of the tank 14.

Further, at the timing of the time T30, since the DIW supply is not operated (turned OFF), and nothing is stored in the tank 14, OFF signals are output from the sixth liquid level sensor and the level sensor.

Then, in time T31 when the phosphoric acid aqueous solution is supplied in a predetermined amount to the tank 14, the controller 3 operates (turns ON) the first pump 16 to form the circulation flow in the circulation path 15.

Next, when the liquid level of the phosphoric acid aqueous solution stored in the tank 14 gradually rises and becomes equal to or higher than the predetermined first height at time T32, an ON signal is output from the first liquid level sensor S1.

Further, when the liquid level of the phosphoric acid aqueous solution becomes equal to or higher than the predetermined sixth height at time T33, an ON signal is output from the sixth liquid level sensor. Then, the controller 3 regards that the phosphoric acid aqueous solution is stored in a predetermined amount in the tank 14, and stops (turns OFF) the phosphoric acid aqueous solution supply 11 at time T33. As a result, the phosphoric acid supplying process is completed, and the predetermined amount of the phosphoric acid aqueous solution is stored in the tank 14.

Subsequently, the controller 3 starts the concentration regulating process by operating (turning ON) the first heater 19 from the time T33 to heat the phosphoric acid aqueous solution that circulates in the circulation path 15. The controller 3 heats the phosphoric acid aqueous solution using the first heater 19, so as to heat the phosphoric acid aqueous solution stored in the tank 14.

As a result, the controller 3 evaporates the phosphoric acid aqueous solution in the mixing device 10, so as to regulate the phosphoric acid concentration of the phosphoric acid aqueous solution from the first concentration to the third concentration.

Then, the liquid level of the phosphoric acid aqueous solution stored in the tank 14 gradually drops, and an OFF signal is output from the sixth liquid level sensor at time T34 when the height of the liquid level becomes lower than the predetermined sixth height.

Next, the controller 3 starts the filtration process by turning OFF the filter bypass at time T35 which is a predetermined time (e.g., 10 minutes) before time T37 when the filtration process to be described later is ended.

Further, when the liquid level of the phosphoric acid aqueous solution stored in the tank 14 becomes lower than the predetermined first height, and an OFF signal is output from the first liquid level sensor S1 at time T36, the controller 3 operates (turns ON) the DIW supply to supply the DIW to the tank 14.

Then, the controller 3 stops (turns OFF) the DIW supply at the time T37 when the predetermined time (e.g., 10 minutes) elapses from the time T35. As a result, the concentration regulating process and the filtration process are completed, and the phosphoric acid aqueous solution with the third concentration as the phosphoric acid concentration is produced in the mixing device 10.

Next, the controller 3 starts the mixing process by operating (turning ON) the precipitation inhibitor supply 12 from the time T37 to supply the precipitation inhibitor to the tank 14. Then, at the time T37, the liquid level of the mixed liquid M becomes equal to or higher than the predetermined first height, and an ON signal is output from the first liquid level sensor S1.

Meanwhile, since the first heater 19 is still operating after the time T37, the mixed liquid M in the mixing device 10 is continuously evaporated, so that the mixed liquid M in the tank 14 becomes lower than the predetermined first height at time T38, and an OFF signal is output from the first liquid level sensor S1 at the time T38.

Next, at time T39 when the precipitation inhibitor is supplied in a predetermined amount to the tank 14, the controller 3 stops (turns OFF) the precipitation inhibitor supply 12. As a result, the mixed liquid M is produced of which the phosphoric acid concentration is regulated to the third concentration, and of which the precipitation inhibitor is regulated to the predetermined concentration.

Then, the controller 3 operates the level sensor using the head pressure at the bottom of the tank 14 at the time T39 as a threshold value. As a result, an ON signal is output from the level sensor at the time T39.

Then, the controller 3 appropriately replenishes the mixed liquid M with the DIW from the DIW supply, based on the signal from the level sensor, during the time until time T43 when the liquid feeding process is started, so as to maintain the phosphoric acid concentration of the mixed liquid M at the third concentration.

Subsequently, the controller 3 starts the liquid feeding process from the time T43. Specifically, the controller 3 opens (turns ON) the first flow rate regulator 23a from the time T43, and stops (turns OFF) the first heater 19. Since the subsequent processes are the same as those in the embodiment illustrated in, for example, FIG. 3, detailed descriptions thereof will be omitted.

As described above, in Modification 3, the mixing process for mixing the phosphoric acid aqueous solution and the precipitation inhibitor with each other is performed after the concentration regulating process for regulating the concentration of the phosphoric acid aqueous solution. In this case as well, the phosphoric acid concentration of the etching liquid E may be further stabilized, so that the etching of the wafers W with the etching liquid E may be appropriately performed.

Further, in Modification 3, the phosphoric acid concentration of the mixed liquid M is regulated based on the level sensor that measures the liquid amount of the tank 14 based on the head pressure at the bottom of the tank 14. As a result, even when the liquid level is disturbed during the mixing process, the phosphoric acid concentration of the mixed liquid M may be stably maintained.

Figure 13:
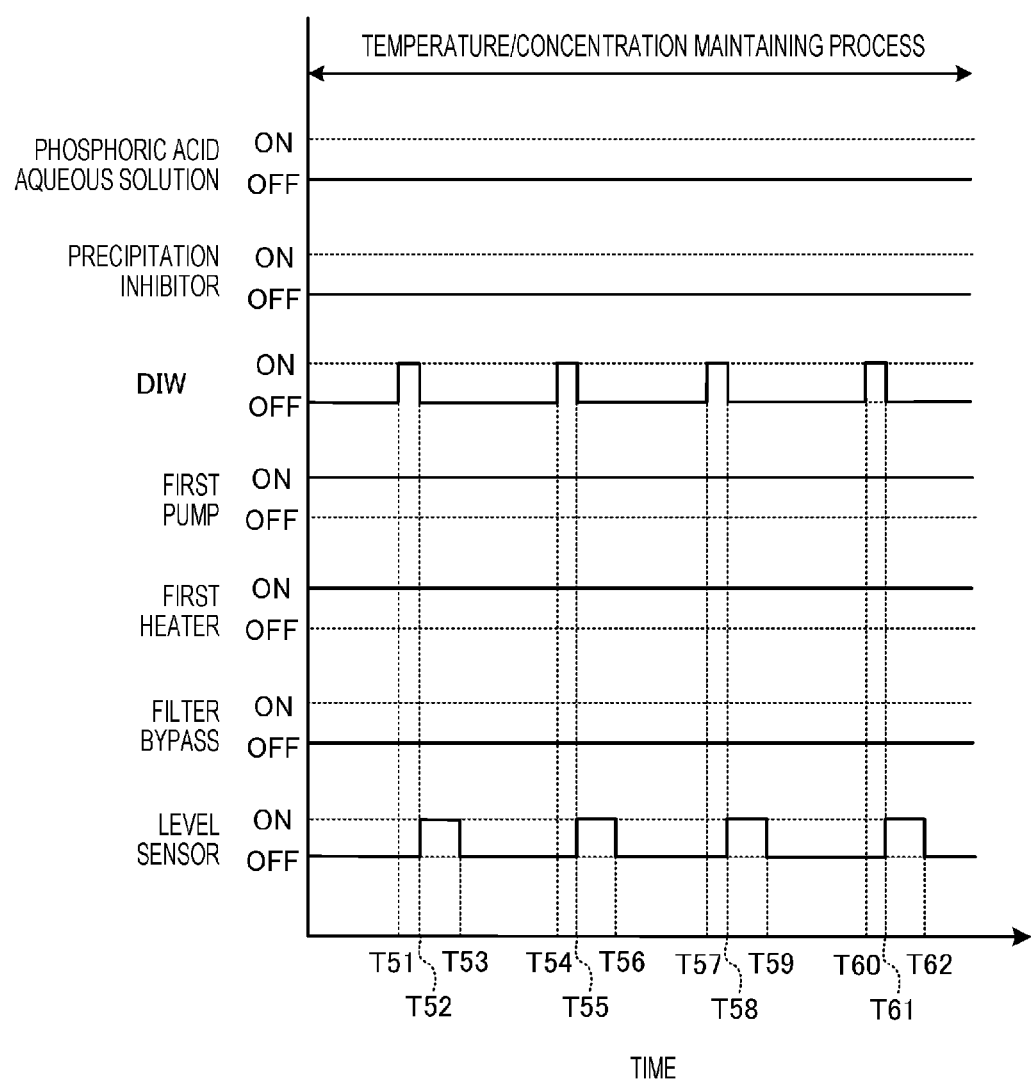
FIG. 13 is a timing chart illustrating a specific example of a behavior pattern of each component of the substrate processing system in a process of maintaining a temperature and a concentration of the mixed liquid in the processing container according to Modification 3 of the embodiment.

FIG. 13 is a timing chart illustrating a specific example of a behavior pattern of each component of the substrate processing system 1 in the process of maintaining the temperature and the concentration of the mixed liquid M in the processing container 31 according to Modification 3 of the embodiment. FIG. 13 is a view illustrating the temperature/concentration maintaining process performed until the liquid feeding process is started after the mixing process illustrated in FIG. 12 is ended.

In the temperature/concentration maintaining process, the controller 3 operates (turns ON) the DIW supply at time TM to supply the DIW to the tank 14.

The time TM is a time after a predetermined time (e.g., 180 seconds) elapses from the time T42 illustrated in FIG. 12 (i.e., the time when the level sensor is switched to the OFF state at the previous time). Further, at the timing of the time T51, the first pump 16 and the first heater 19 are operated (turned ON), while the phosphoric acid aqueous solution supply 11 and the precipitation inhibitor supply 12 are not operated (turned OFF).

Further, at the timing of the time TM, since the opening/closing valve 21a is in the closed state, the filter 18 is in the state of not being bypassed by the bypass flow path 21 (OFF state of the filter bypass).

Then, at time T52 when the head pressure at the bottom of the tank 14 becomes equal to or higher than the predetermined threshold value set at the time T39 described above, and an ON signal is output from the level sensor, the controller 3 stops (turns OFF) the DIW supply.

Meanwhile, since the first heater 19 is still operating after the time T52, the mixed liquid M in the mixing device 10 is continuously evaporated, so that the head pressure of the bottom of the tank 14 becomes lower than a predetermined threshold value at time T53, and an OFF signal is output from the level sensor at the time T53.

Then, the controller 3 operates (turns ON) the DIW supply at time T54 when a predetermined time (e.g., 180 seconds) elapses from the time T53, to supply the DIW to the tank 14.

Then, at time T55 when the head pressure of the bottom of the tank 14 becomes equal to or higher than the predetermined threshold value, and an ON signal is output from the level sensor, the controller 3 stops (turns OFF) the DIW supply. Since the subsequent processes are a repetition of the processes described above as illustrated in FIG. 13, detailed descriptions thereof will be omitted.

As described above, in the temperature/concentration maintaining process of Modification 3, the mixed liquid M is appropriately replenished with the DIW from the DIW supply, based on the signal from the level sensor, during the time until the liquid feeding process is started, so as to maintain the phosphoric acid concentration of the mixed liquid M at the third concentration.

Further, in Modification 3, the DIW supply may be operated after the predetermined time (e.g., 180 seconds) elapses, rather than being operated immediately at the timing when the OFF signal is output from the level sensor (e.g., the time T53).

As a result, the mixed liquid M may be replenished with the DIW while considering the time required until the DIW is reflected in the concentration of the mixed liquid M after being supplied to the tank 14. Thus, according to Modification 3, the variation in phosphoric acid concentration of the mixed liquid M may be reduced.

While Modification 3 represents an example where the mixing process is performed after the concentration regulating process when the mixed liquid M is fed to the processing container 31 at a first time, the present disclosure is not limited to the example. For example, as illustrated in FIG. 4, the mixing process may be performed after the concentration regulating process, in the process of preparing and feeding the mixed liquid M to be fed when the etching of the wafers W is started in the processing container 31, and silicon is eluted from the wafers W into the etching liquid E.

That is, in Modification 3, when the mixed liquid M with the second concentration as the phosphoric acid concentration is prepared in the mixing device 10, the concentration of the phosphoric acid aqueous solution may be regulated to the second concentration, and thereafter, the mixing process for mixing the phosphoric acid aqueous solution and the precipitation inhibitor with each other may be performed.

The substrate processing apparatus (the substrate processing system 1) according to the embodiment includes the processing container 31, the mixing device 10, the liquid feeding path 22, and the controller 3. In the processing container 31, the substrates (the wafers W) are processed by being immersed in the processing liquid (the etching liquid E). The mixing device 10 mixes the phosphoric acid aqueous solution and the additive with each other, to produce the mixed liquid M to be used as a raw material of the processing liquid (the etching liquid E). The liquid feeding path 22 feeds the mixed liquid M from the mixing device 10 to the processing container 31. The controller 3 controls each component. Further, the controller 3 feeds the mixed liquid M of which the phosphoric acid concentration is regulated in the mixing device 10 to the second concentration higher than the first concentration when the phosphoric acid aqueous solution is supplied to the mixing device 10, from the mixing device 10 to the processing container 31 in which the substrates (the wafers W) are being immersed. As a result, the etching with the etching liquid E that contains the phosphoric acid aqueous solution and the additive may be appropriately performed.

In the substrate processing apparatus (the substrate processing system 1) according to the embodiment, the controller 3 supplies the additive to the phosphoric acid aqueous solution supplied to the mixing device 10, to produce the mixed liquid M, and then, regulates the phosphoric acid concentration of the mixed liquid M from the first concentration to the second concentration higher than the first concentration. As a result, the etching with the etching liquid E that contains the phosphoric acid aqueous solution and the additive may be appropriately performed.

In the substrate processing apparatus (the substrate processing system 1) according to the embodiment, the controller 3 regulates the concentration of the phosphoric acid aqueous solution supplied to the mixing device 10 from the first concentration to the second concentration higher than the first concentration, and then, mixes the phosphoric acid aqueous solution having the second concentration with the additive. As a result, the etching with the etching liquid E that contains the phosphoric acid aqueous solution and the additive may be appropriately performed.

In the substrate processing apparatus (the substrate processing system 1) according to the embodiment, the controller 3 controls the phosphoric acid concentration of the mixed liquid M that has been fed to the processing container 31 and has the second concentration as the phosphoric acid concentration, to the third concentration higher than the second concentration. As a result, the silicon nitride film formed on the wafers W may be efficiently selectively etched.

In the substrate processing apparatus (the substrate processing system 1) according to the embodiment, the controller 3 feeds the mixed liquid M with the second concentration as the phosphoric acid concentration from the mixing device 10 to the processing container 31, before the process of immersing the substrates (the wafers W) is started. Further, the controller 3 regulates the phosphoric acid concentration of the processing liquid (the etching liquid E) using the mixed liquid M as a raw material, to the third concentration higher than the second concentration. As a result, the silicon nitride film formed on the wafers W may be efficiently selectively etched.

In the substrate processing apparatus (the substrate processing system 1) according to the embodiment, the mixing device 10 includes the heating mechanism (the first heater 19). Further, the controller 3 heats the mixed liquid M using the heating mechanism (the first heater 19) to regulate the phosphoric acid concentration of the mixed liquid M to the second concentration. As a result, the mixed liquid M with the second concentration which is the relatively high phosphoric acid concentration may be efficiently produced.

In the substrate processing apparatus (the substrate processing system 1) according to the embodiment, the liquid feeding path 22 includes the branch portions 22b1 and 22b2. The substrate processing apparatus (the substrate processing system 1) according to the embodiment further includes the return paths 24 that return the mixed liquid M from the branch portions 22b1 and 22b2 to the mixing device 10. As a result, the process of maintaining the silicon concentration in the processing container 31 to be constant or equal to or lower than a certain concentration may be more accurately performed, and the mixed liquid M may be stably heated.

In the substrate processing apparatus (the substrate processing system 1) according to the embodiment, the plurality of mixing devices 10A and 10B are connected to one processing container 31 via the liquid feeding paths 22A and 22B. As a result, the etching of the wafers W with the etching liquid E may be more appropriately performed in one processing container 31.

In the substrate processing apparatus (the substrate processing system 1) according to the embodiment, the controller 3 sequentially feeds the mixed liquid M from one of the plurality of mixing devices 10 to one processing container 31 in which the substrates (the wafers W) are being immersed. Further, the controller 3 regulates the phosphoric acid concentration of the mixed liquid M in the other mixing device 10 from the first concentration to the second concentration. As a result, the etching of the wafers W with the etching liquid E may be more appropriately performed in one processing container 31.

In the substrate processing apparatus (the substrate processing system 1) according to the embodiment, the plurality of mixing devices 10A to 10C are connected to the plurality of processing containers 31A to 31C via the liquid feeding paths 22A to 22C. Further, the liquid feeding paths 22A to 22C individually feed the mixed liquid from one of the mixing devices 10A to 10C to the plurality of processing containers 31A to 31C. As a result, the etching of the wafers W with the etching liquid E may be more appropriately performed in the plurality of processing containers 31A to 31C.

In the substrate processing apparatus (the substrate processing system 1) according to the embodiment, the controller 3 sequentially feeds the mixed liquid M from one of the plurality of mixing devices 10 to the plurality of processing containers 31A to 31C in which the substrates (the wafers W) are being immersed. Further, the controller 3 regulates the phosphoric acid concentration of the mixed liquid M in the other mixing devices 10 from the first concentration to the second concentration. As a result, the etching of the wafers W with the etching liquid E may be more appropriately performed in the plurality of processing containers 31A to 31C.

<Details of Substrate Processing>

Figure 14:
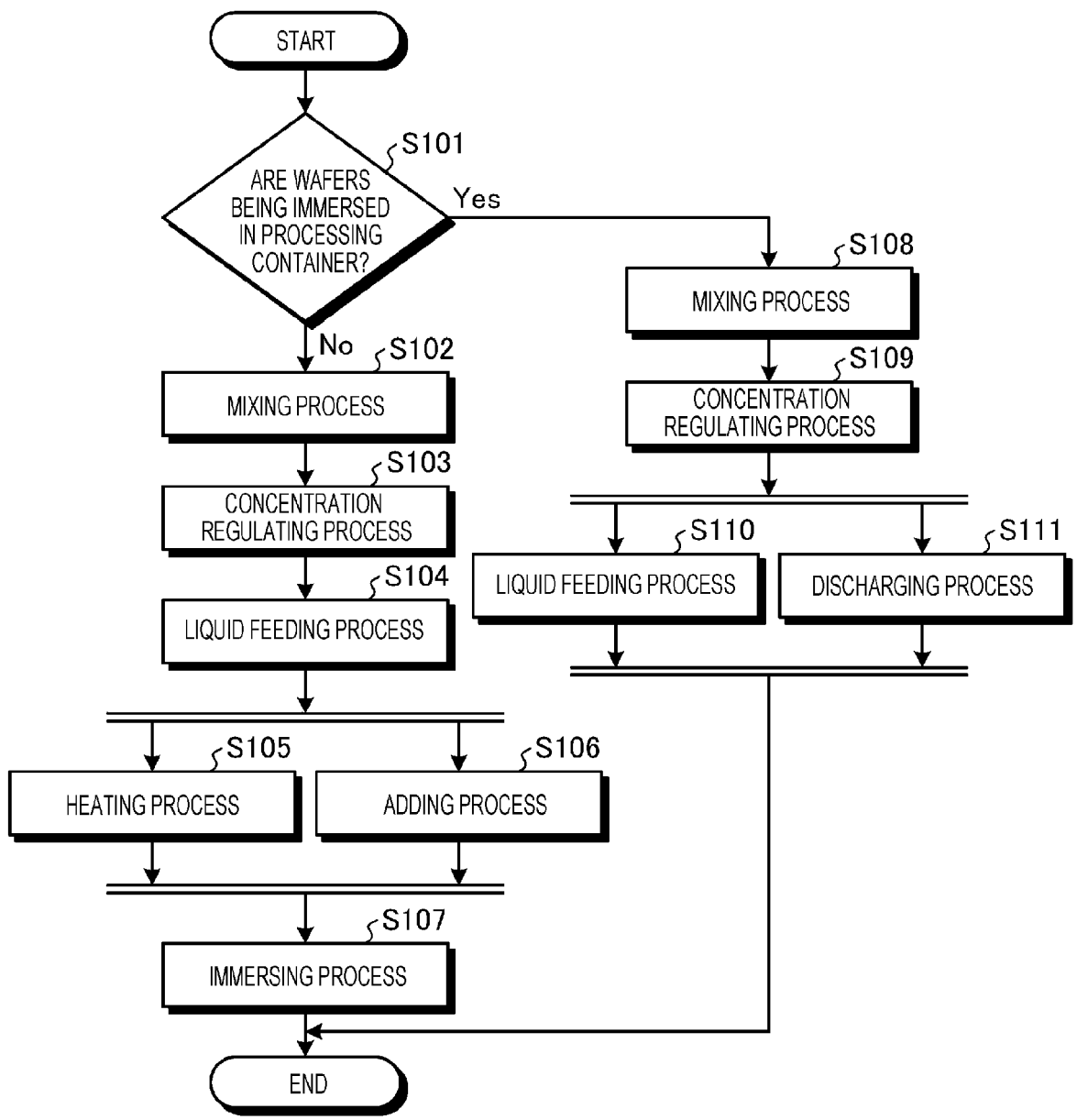
FIG. 14 is a flowchart illustrating a process procedure of a substrate processing according to the embodiment.

Subsequently, details of the substrate processing performed by the substrate processing system 1 according to the embodiment and Modification 3 will be described with reference to FIGS. 14 and 15. FIG. 14 is a flowchart illustrating the process procedure of the substrate processing according to the embodiment.

First, the controller 3 determines whether the wafers W are being immersed in the processing container 31 (step S101). Then, when it is determined that the wafers W are not being immersed in the processing container 31 (step S101, No), for example, when the liquid replacing process is being performed in the processing container 31, the controller 3 performs the mixing process for mixing the phosphoric acid aqueous solution and the additive with each other in the mixing device 10 (step S102).

Next, the controller 3 controls the first heater 19 to perform the concentration regulating process for regulating the phosphoric acid concentration of the produced mixed liquid M from the first concentration to the third concentration (step S103).

Next, the controller 3 controls the mixing device 10 and the first liquid feeding path 22a to perform the liquid feeding process for feeding the mixed liquid M to the processing container 31 (step S104). Then, the controller 3 controls the substrate processing unit 30 to perform the heating process for heating the mixed solution M (step S105).

Further, in parallel with the process of step S105, the controller 3 controls the silicon solution supply 25 to perform the adding process for adding the silicon solution to the mixed liquid M in the processing container 31 (step S106).

Finally, the controller 3 controls the substrate processing unit 30 to perform the immersing process for immersing the wafers W in the etching liquid E prepared in the processing container 31 (step S107), and completes the processing.

While the embodiment described above represents an example where the phosphoric acid concentration of the mixed liquid M is regulated from the first concentration to the third concentration in the concentration regulating process (step S103), the present disclosure is not limited to the example.

For example, in the concentration regulating process (step S103), the controller 3 regulates the phosphoric acid concentration of the mixed liquid M from the first concentration to the second concentration, and feeds the phosphoric acid of the second concentration into the processing container 31.

Then, in the heating process for heating the mixed liquid M in the processing container 31 (step S105), the controller 3 may control the second heater 41 to regulate the phosphoric acid concentration from the second concentration to the third concentration.

In this case as well, the wafers W may be immersed in the etching liquid E of which the phosphoric acid concentration has been regulated to the third concentration, so that the silicon nitride film formed on the wafers W may be efficiently selectively etched.

Meanwhile, when it is determined that the wafers W are being immersed in the processing container 31 (step S101, Yes), for example, when the wafers W are being etched in the processing container 31, the controller 3 performs the mixing process for mixing the phosphoric acid aqueous solution and the additive with each other in the mixing device 10 (step S108).

Next, the controller 3 controls the first heater 19 to perform the concentration regulating process for regulating the phosphoric acid concentration of the produced mixed liquid M from the first concentration to the second concentration (step S109).

Next, the controller 3 controls the mixing device 10, the second liquid feeding path 22b, and the return path 24 to perform the liquid feeding process for feeding the mixed liquid M to the processing container 31 (step S110). In parallel with the liquid feeding process, the controller 3 performs the discharging process for discharging the mixed liquid M that contains the silicon solution, from the processing container 31 (step S111).

As a result, the silicon concentration of the etching liquid E in the processing container 31 may be maintained to be constant or equal to or lower than a certain concentration at all times. Then, when the processes of steps S110 and S111 is ended, the processing is completed.

Figure 15:
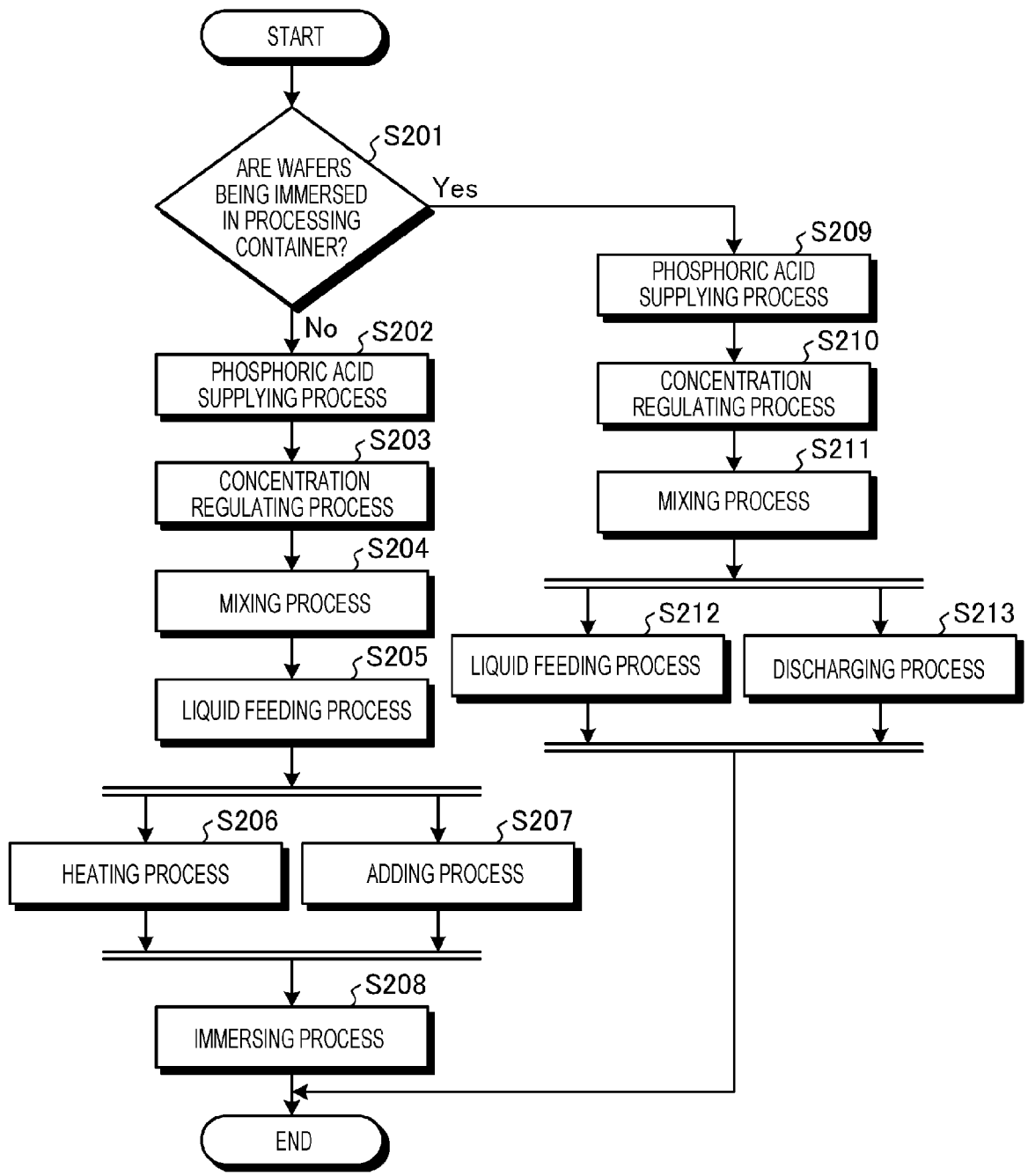
FIG. 15 is a flowchart illustrating a process procedure of a substrate processing according to Modification 3 of the embodiment.

FIG. 15 is a flowchart illustrating the process procedure of the substrate processing according to Modification 3 of the embodiment. First, the controller 3 determines whether the wafers W are being immersed in the processing container 31 (step S201).

When it is determined that the wafers W are not being immersed in the processing container 31 (steps S201, No), for example, when the liquid replacing process is being performed in the processing container 31, the controller 3 performs the phosphoric acid supplying process for supplying the phosphoric acid aqueous solution to the mixing device 10 (step S202).

Next, the controller 3 controls the first heater 19 to perform the concentration regulating process for regulating the phosphoric acid concentration of the produced mixed liquid M from the first concentration to the third concentration (step S203). Then, the controller 3 performs the mixing process for mixing the concentration-regulated aqueous phosphoric acid solution and the additive with each other in the mixing device 10 (step S204).

Next, the controller 3 controls the mixing device 10 and the first liquid feeding path 22a to perform the liquid feeding process for feeding the mixed liquid M to the processing container 31 (step S205). Then, the controller 3 controls the substrate processing unit 30 to perform the heating process for heating the mixed liquid M (step S206).

Further, in parallel with the process of step S206, the controller 3 controls the silicon solution supply 25 to perform the adding process for adding the silicon solution to the mixed liquid M in the processing container 31 (step S207).

Finally, the controller 3 controls the substrate processing unit 30 to perform the immersing process for immersing the wafers W in the etching liquid E prepared in the processing container 31 (step S208), and completes the processing.

While Modification 3 described above represents an example where the phosphoric acid concentration of the mixed liquid M is regulated from the first concentration to the third concentration in the concentration regulating process (step S203), the present disclosure is not limited to the example.

For example, in the concentration regulating process (step S203), the controller 3 regulates the phosphoric acid concentration of the mixed liquid M from the first concentration to the second concentration, and feeds the phosphoric acid of the second concentration into the processing container 31.

Then, in the heating process for heating the mixed liquid M in the processing container 31 (step S206), the controller 3 may control the second heater 41 to regulate the phosphoric acid concentration from the second concentration to the third concentration.

In this case as well, the wafers W may be immersed in the etching liquid E of which the phosphoric acid concentration has been regulated to the third concentration, so that the silicon nitride film formed on the wafers W may be efficiently selectively etched.

Meanwhile, when it is determined that the wafers W are being immersed in the processing container 31 (steps S201, Yes), for example, when the wafers W are being etched in the processing container 31, the controller 3 performs the phosphoric acid supplying process for supplying the phosphoric acid aqueous solution to the mixing device 10 (step S209).

Next, the controller 3 controls the first heater 19 to perform the concentration regulating process for regulating the phosphoric acid concentration of the produced mixed liquid M from the first concentration to the second concentration (step S210). Then, the controller 3 performs the mixing process for mixing the concentration-regulated phosphoric acid aqueous solution and the additive with each other in the mixing device 10 (step S211).

Next, the controller 3 controls the mixing device 10, the second liquid feeding path 22b, and the return paths 24, to perform the liquid feeding process for feeding the mixed liquid M to the processing container 31 (step S212). Further, in parallel with the liquid feeding process, the controller 3 performs the discharging process for discharging the mixed liquid M that contains the silicon solution from the processing container 31 (step S213).

As a result, the silicon concentration of the etching liquid E in the processing container 31 may be maintained to be constant or equal to or lower than a certain concentration at all times. Then, when the processes of steps S212 and S213 are ended, the processing is completed.

A substrate processing method according to an embodiment includes the concentration regulating process (step S109) and the liquid feeding process (step S110). The concentration regulating process regulates the phosphoric acid concentration of the mixed liquid M from the first concentration to the second concentration higher than the first concentration, in the mixing device 10 that mixes the phosphoric acid aqueous solution and the additive with each other to produce the mixed liquid M to be used as a raw material of the processing liquid (the etching liquid E). The liquid feeding process (step S110) feeds the mixed liquid M with the second concentration as the phosphoric acid concentration from the mixing device 10 to the processing container 31 in which the substrates (the wafers W) are being immersed. As a result, the etching with the etching liquid E that contains the phosphoric acid aqueous solution and the additive may be appropriately performed.

A substrate processing method according to an embodiment includes the phosphoric acid aqueous solution supplying process (step S209), the concentration regulating process (step S210), the mixing process (step S211), and the liquid feeding process (step S212). The phosphoric acid aqueous solution supplying process (step S209) supplies the phosphoric acid aqueous solution to the mixing device 10 that produces the mixed solution M to be used as a raw material of the processing liquid. The concentration regulating process (step S210) regulates the phosphoric acid aqueous solution from the first concentration to the second concentration higher than the first concentration. The mixing process (step S211) supplies the additive to the phosphoric acid aqueous solution to produce the mixed liquid M. The liquid feeding process (step S212) feeds the mixed liquid M from the mixing device 10 to the processing container 31 in which the substrates (the wafers W) are being immersed. As a result, the etching with the etching liquid E that contains the phosphoric acid aqueous solution and the additive may be appropriately performed.

The substrate processing method according to the embodiment controls the phosphoric acid concentration of the mixed liquid M that has been fed to the processing container 31 in the liquid feeding process (step S110) and has the second concentration as the phosphoric acid concentration, to the third concentration higher than the second concentration. As a result, the silicon nitride film formed on the wafers W may be efficiently selectively etched.

The substrate processing method according to the embodiment feeds the mixed liquid M with the second concentration as the phosphoric acid concentration from the mixing device 10 to the processing container 31 before the immersing process of the substrates is started, to regulate the phosphoric acid concentration of the processing liquid (the etching liquid E) using the mixed liquid M as a raw material to the third concentration higher than the second concentration. As a result, the silicon nitride film formed on the wafers W may be efficiently selectively etched.

While the embodiments of the present disclosure have been described, the present disclosure is not limited to the embodiments, and various changes may be made without departing from the gist of the present disclosure. For example, while the embodiments described above represent an example where the concentration regulating process is performed by heating the mixed liquid M, the concentration regulating process for the mixed liquid M is not limited to the process of heating the mixed liquid M.

For example, since the mixed liquid M may be evaporated by reducing the pressure in the atmosphere of the tank 14, the concentration regulating process for the mixed liquid M may be performed. Further, while the embodiments described above represent the precipitation inhibitor that suppresses the precipitation of silicon oxide as an example of the additive, the additive may be, for example, a silicon compound additive, and does not need to necessarily be the precipitation inhibitor.

According to the present disclosure, an etching with an etching liquid that contains an aqueous phosphoric acid solution and a precipitation inhibitor may be appropriately performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a processing container configured to process a substrate by immersing the substrate in a processing liquid;
a silicon solution supply configured to supply a silicon solution directly to the processing container;
a phosphoric acid aqueous solution supply configured to supply a phosphoric acid aqueous solution;
an additive supply configured to supply an additive;
a mixer configured to mix phosphoric acid aqueous solution and additive to produce a mixed liquid to be used as a raw material of the processing liquid;
a liquid feeding path configured to feed the mixed liquid from the mixer to the processing container; and
a controller configured to control an overall operation of the substrate processing apparatus,
wherein the controller is programmed to perform a first processing in a state where the processing container is initially empty including:
supplying a first quantity of the phosphoric acid aqueous solution to the mixer,
performing a first regulating process in the mixer to regulate a phosphoric acid concentration of the first quantity of the phosphoric acid aqueous solution from a first concentration to a third concentration higher than the first concentration,
performing a first mixing process by adding a first quantity of the additive to the first quantity of the phosphoric acid aqueous solution having the third concentration in the mixer to produce a first mixed liquid,
performing a first feeding process to feed the first mixed liquid to the processing container,
supplying the silicon solution directly to the processing container to combine with the first mixed liquid fed to the processing container in the first feeding process to form the processing liquid, and
immersing the substrate in the processing liquid, and
wherein the controller is further programmed to perform a second processing in a state where the substrate is still immersed in the processing liquid from the first processing including:
supplying a second quantity of the phosphoric acid aqueous solution to the mixer,
performing a second regulating process in the mixer to regulate a phosphoric acid concentration of the second quantity of the phosphoric acid aqueous solution supplied to the mixer to a second concentration higher than the first concentration and lower than the third concentration,
performing a second mixing process by adding a second quantity of the additive to the second quantity of the phosphoric acid aqueous solution having the second concentration in the mixer to produce a second mixed liquid,
performing a second feeding process to feed the second mixed liquid having the second concentration from the mixer to the processing container in which the substrate is immersed, and regulating a silicon concentration of the processing liquid.

2. The substrate processing apparatus according to claim 1, wherein the mixer includes a heater, and
in the first regulating process, the controller is programmed to control the heater to heat the first quantity of the phosphoric acid aqueous solution thereby regulating the phosphoric acid concentration of the first quantity of the phosphoric acid aqueous solution from the first concentration to the third concentration.

3. The substrate processing apparatus according to claim 1, wherein the liquid feeding path includes a branch,
the substrate processing apparatus further comprises a return path configured to return the mixed liquid from the branch to the mixer.

4. The substrate processing apparatus according to claim 1, wherein the mixer is provided in plural, and the plurality of mixers are connected to the single processing container through the liquid feeding path.

5. The substrate processing apparatus according to claim 4, wherein in the second processing, the controller is programmed to:
sequentially feed the second mixed liquid from one of the plurality of mixers to the single processing container in which the substrate is immersed, and
regulate the phosphoric acid concentration of the second mixed liquid in another mixer of the plurality of mixers to a same concentration as the second concentration.

6. The substrate processing apparatus according to claim 1, wherein the processing container and the mixer are provided in plural, and the plurality of mixers are connected to the plurality of processing containers through the liquid feeding path, and
the liquid feeding path individually feeds the first mixed liquid from one of the plurality of mixers to the plurality of processing containers.

7. The substrate processing apparatus according to claim 6, wherein in the second processing the controller is programmed to:
sequentially feed the second mixed liquid from one of the plurality of mixers to the plurality of processing containers in which the substrate is immersed, and
regulate the phosphoric acid concentration of the second mixed liquid in another mixer of the plurality of mixers to a same concentration as the second concentration.

8. The substrate processing apparatus according to claim 1, wherein the mixer includes a heater, and
in the second regulating process, the controller is programmed to control the heater to heat the second quantity of the phosphoric acid aqueous solution, thereby regulating the concentration of the second quantity of the phosphoric acid aqueous solution to the second concentration.

9. The substrate processing apparatus according to claim 8, wherein the liquid feeding path includes a branch, the substrate processing apparatus further comprises a return path configured to return the mixed liquid from the branch to the mixer.

10. The substrate processing apparatus according to claim 9, wherein the mixer is provided in plural, and the plurality of mixers are connected to the single processing container through the liquid feeding path.

11. The substrate processing apparatus according to claim 1, wherein the additive is a precipitation inhibitor for suppressing precipitation of silicon oxide.

12. A substrate processing method comprising:
performing a first processing in a state where a processing container is initially empty including:
supplying a first quantity of a phosphoric acid aqueous solution to a mixer,
regulating in the mixer a phosphoric acid concentration of the first quantity of the phosphoric acid aqueous solution from a first concentration to a third concentration higher than the first concentration,
mixing by adding a first quantity of an additive to the first quantity of the phosphoric acid aqueous solution having the third concentration in the mixer to produce a first mixed liquid,
first feeding the first mixed liquid to the processing container,
supplying a silicon solution directly to the processing container to combine with the first mixed liquid fed to the processing container in the first feeding process to form a processing liquid,
immersing a substrate in the processing liquid,
performing a second processing in a state where the substrate is still immersed in the processing liquid from the first processing including:
supplying a second quantity of the phosphoric acid aqueous solution to the mixer,
regulating the concentration of the phosphoric acid aqueous solution to a second concentration higher than the first concentration and lower than the third concentration in the mixer,
mixing by adding a second quantity of the additive to the second quantity of the phosphoric acid aqueous solution having the second concentration in the mixer to produce a second mixed liquid,
second feeding the second mixed liquid from the mixer to the processing container in which the substrate is immersed, and
regulating a silicon concentration of the processing liquid.

13. The substrate processing method according to claim 12, wherein in the first regulating step, heating the first quantity of the phosphoric acid aqueous solution, thereby regulating the phosphoric acid concentration of the first quantity of the phosphoric acid aqueous solution from the first concentration to the third concentration.

* * * * *